US008461643B2

(12) United States Patent
Lee

(10) Patent No.: US 8,461,643 B2
(45) Date of Patent: Jun. 11, 2013

(54) HIGH-DENSITY FLASH MEMORY CELL STACK, CELL STACK STRING, AND FABRICATION METHOD THEREOF

(75) Inventor: Jong-Ho Lee, Seoul (KR)

(73) Assignee: SNU R & DB Foundation (KR)

( * ) Notice: Subject to any disclaimer, the term of this patent is extended or adjusted under 35 U.S.C. 154(b) by 37 days.

(21) Appl. No.: 13/123,458

(22) PCT Filed: Sep. 24, 2009

(86) PCT No.: PCT/KR2009/005463
§ 371 (c)(1),
(2), (4) Date: Apr. 8, 2011

(87) PCT Pub. No.: WO2010/041838
PCT Pub. Date: Apr. 15, 2010

(65) Prior Publication Data
US 2011/0198687 A1    Aug. 18, 2011

(30) Foreign Application Priority Data
Oct. 9, 2008  (KR) .................. 10-2008-0099231

(51) Int. Cl.
*H01L 27/115*  (2006.01)
(52) U.S. Cl.
USPC ........................................... 257/326
(58) Field of Classification Search
USPC .................................. 257/326, 327
See application file for complete search history.

(56) References Cited

U.S. PATENT DOCUMENTS

| 7,115,476 | B1 * | 10/2006 | Izumida ................ 438/268 |
| 7,118,988 | B2 * | 10/2006 | Buerger, Jr. et al. ........ 438/437 |
| 7,504,294 | B2 * | 3/2009 | Sugimae et al. ............ 438/201 |
| 8,198,672 | B2 * | 6/2012 | Alsmeier ................ 257/326 |
| 2007/0034931 | A1 | 2/2007 | Wu |
| 2008/0128757 | A1 | 6/2008 | Chae et al. |
| 2008/0173928 | A1 * | 7/2008 | Arai et al. ................ 257/316 |
| 2009/0029511 | A1 * | 1/2009 | Wu ................ 438/261 |

(Continued)

FOREIGN PATENT DOCUMENTS
KR   10-2008-0050654    6/2008

OTHER PUBLICATIONS

Wen-Jer Tsai et al., "A Novel Trapping-Nitride-Storage Non-Volatile Memory Cell Using a Gated-Diode Structure With an Ultra-Thin Dielectric Dopant Diffusion Barrier," IEEE Transactions on Electron Devices, vol. 55, No. 8, Aug. 2008, pp. 2202-2211.

(Continued)

*Primary Examiner* — Nathan Ha
(74) *Attorney, Agent, or Firm* — Cantor Colburn LLP

(57) ABSTRACT

A flash memory cell stack includes a semiconductor substrate; a control electrode formed in a vertical pillar shape on a surface of the semiconductor substrate; an insulating film formed between the control electrode and the semiconductor substrate; a gate stack formed on a side surface of the control electrode; a plurality of first insulating films formed as layers on a side surface of the gate stack; a plurality of second doping semiconductor areas formed as layers on a side surface of the gate stack; and a first doping semiconductor area formed on a portion of side surfaces of the first insulating films and the second doping semiconductor areas and formed on side surfaces facing each other in a first direction. The first insulating films and the second doping semiconductor areas are alternately provided on the side surface of the gate stack.

14 Claims, 18 Drawing Sheets

U.S. PATENT DOCUMENTS

| | | | |
|---|---|---|---|
| 2009/0224305 A1* | 9/2009 | Hayashi | 257/316 |
| 2009/0224306 A1* | 9/2009 | Hayashi | 257/316 |
| 2009/0267131 A1* | 10/2009 | Nitta | 257/316 |
| 2010/0038698 A1 | 2/2010 | Lee | |
| 2010/0072559 A1* | 3/2010 | Lee et al. | 257/393 |
| 2010/0140688 A1* | 6/2010 | Fujimoto | 257/329 |
| 2010/0155813 A1* | 6/2010 | Murata et al. | 257/316 |

OTHER PUBLICATIONS

International Search Report—PCT/KR2009/005463 dated May 12, 2010.

Alvaro Padilla et al., "Enhanced Endurance of Dual-bit SONOS NVM Cells using the GIDL Read Method," Symposium on VLSI Technology Digest of Technical Papers, 2008, pp. 142-143.

Sang-Pil Sim et al., "Fully 3-Dimensional nor Flash Cell with Recessed Channel and Cylindrical Floating Gate-A Scaling Dirction for 65nm and Beyond," Symposium on VLSI Technology Digest of Technical Papers, 2006.

Ki-Tae Park et al., "A 64-Cell NAND Flash Memory with Asymetrical S/D Structure for Sub-40nm Technology and Beyond," Symposium on VLSI Technology Digest of Technical Papers, 2006.

* cited by examiner (a)

(b)

(a)

(b)

(a)

(b)

(a)

(b)

HIGH-DENSITY FLASH MEMORY CELL STACK, CELL STACK STRING, AND FABRICATION METHOD THEREOF

BACKGROUND (1) Field of the Invention

The present invention relates to a flash memory cell stack, a cell stack string, and a fabricating method thereof and, more particularly, to a flash memory cell stack and a cell stack string which are not based on a MOS transistor and which are implemented by using a diode type structure and a fabricating method thereof.

(2) Description of the Related Art

Recently, since demands for a flash memory greatly increase in consumer electronics and mobile electronic apparatuses, a market of the flash memory is expected to continuously increase. In addition, demands for a cell device having a high degree of integration, a high durability, and high-speed write/erase characteristics have been increased. Particularly, the integration degree of a NAND flash memory has been required to continuously increase as IT technologies are developed. Integration density of the NAND flash memory greatly depends on integration density of the cell devices. Recently, the gate length of a cell device is reduced down to 50 nm, and the memory capacity reaches several tens of giga bits. In addition, demands for multi-level cell (MLC) devices have been increased. However, there is a problem in that the short channel effect due to device miniaturization increases dispersion of a threshold voltage in the implementation of the multi-level cell or decreases a change of the threshold voltage according to program/erase. In order to improve integration density, the gate length needs to be continuously reduced. Therefore, other techniques have to be considered.

In an existing NAND flash memory using floating gates, serious problems of cross-talk between cells occur as cell miniaturization proceeds. In order to increase integration density of an existing device having a floating poly electrode, an SONOS flash memory cell that uses an insulating storage electrode such as nitride layer as a memory storage node has been considered. In addition, a nano-floating gate memory (NFGM) cell that uses nano-sized dots or nano-sized crystals as a storage electrode has been considered. In a case where a memory cell is embodied by using a storage electrode such as nano-sized dots or a nitride layer on an existing planar channel structure, miniaturization characteristics can be improved in comparison with a case where a memory cell is embodied by using an existing conductive polysilicon floating gate. However, although the improved storage electrode is used, in a case where the gate length is equal to or less than 30 nm, the characteristics are greatly deteriorated, or the miniaturization may not be obtained due to the short channel effect.

In order to suppress the short channel effect caused in a case where a gate length of a cell device decreases below 40 nm and reduce a dispersion of a threshold voltage, an SONOS or TANOS (TaN—AlO—SN-Oxide-Si) cell device having an asymmetric source/drain structure on a planar channel device is proposed by Samsung Electronics Co., Ltd (K. T. Park et al, A 64-cell NAND flash memory with asymmetric S/D structure for sub-40 nm technology and beyond, in Technical Digest of Symposium on VLSI Technology, p. 24, 2006). The aforementioned the cell device has a structure where, with respect to a gate of the cell device, there is a region corresponding to a source or a drain in the one side thereof, and there is neither source nor drain in the other side thereof. In the cell device having the structure, the short channel effect is suppressed by forming an inversion layer using a fringe field from a control electrode in the region where there is neither source nor drain. Although the miniaturization characteristic of the cell device is improved in comparison with an existing SONOS the cell device having a planar channel and a source/drain region, since one of the source and the drain of the cell device is formed so as to be overlapped with the control electrode, the short channel effect occurs in the channel length equal to or less than 40 nm. As a result, there is a limitation in miniaturization of the cell device having a flat channel structure. In addition, as the miniaturization proceeds, the fabricating processes become difficult.

A flash device structure in which a channel is recessed and a conductive floating gate is used as a storage electrode so as to reduce the short channel effect occurring in the existing planar channel structure is proposed by Samsung Electronics Co., Ltd. (S.-P. Sim et al, Full 3-dimensional NOR flash cell with recessed channel and cylindrical floating gate—A scaling direction for 65 nm and beyond, in Technical Digest of Symposium on VLSI Technology, p. 22, 2006). However, in the flash device having such a structure, the width of the recessed region needs to be reduced as the device miniaturization proceeds. Accordingly, there is a problem in that device characteristics deteriorate, and non-uniformity of the device increases.

The inventor has researched a NAND string structure having no source/drain, and the invention titled, "Highly-Integrated Flash Memory Cell String Cell Device, and Method of Fabricating thereof" was filed and registered as Korean Patent No. 10-856701. With respect to the structure disclosed in the invention, the process of fabricating a NAND string is simple, and there is no source/drain in the cell device, so that it is possible to improve device miniaturization characteristics, program characteristics, and the like. Herein, although the cell device has no source/drain, the cell device is based on a MOS structure having a channel.

A result of research of implementing memory operations by reading GIDL (Gate Induced Drain Leakage) in a FinFET-based SONOS flash memory, of which the device miniaturization characteristics are good, at the level of a single cell device was published (Alvaro Padilla et al, Enhanced endurance of dual-bit SONOS NVM cells using the GIDL read method, in Technical Digest of Symposium on VLSI Technology, p. 143, 2008). Since the cell device is also based on the cell having a MOS structure, there are problems such as problems in the processes of fabricating a miniaturized MOS device and problems of a change in a threshold voltage.

An article on a memory cell device using a gated-diode structure as a cell device different from an existing cell device using a MOS structure was published by Macronix (Wen-Jer Tsai et al., "A novel non-volatile memory cell using a gated-diode structure with a trapping-nitride storage layer," in VLSI Symp. Tech Dig., 2006, pp. 52-53). According to the research, in the cell device, a p-n junction is formed in an upper portion of a fin body, and charges are stored or removed in a charge storage node in the vicinity of the p-n junction, so that a difference of current according to band-to-band tunneling is sensed. The whole structure of the device is complicated. The program/erase is performed at localized positions, so that there is a problem in that deterioration problem occurs. In addition, since gate stacks including storage nodes is formed around the fin body and control electrodes are formed, there is a problem in that integration density is decreased, as the area of a unit cell is increased.

SUMMARY OF THE INVENTION

The present invention is to provide a diode type non-volatile memory cell device having an excellent device miniaturization characteristic.

The present invention is also to provide an ultra highly-integrated non-volatile memory cell stack including the diode type cell devices in a stack structure and a method of fabricating the cell stack.

The present invention is also to provide a cell stack string including the cell stacks and a method of fabricating the cell stack string.

According to a first aspect of the present invention, there is provided a flash memory cell stack including: a semiconductor substrate; a control electrode formed in a vertical pillar shape on a surface of the semiconductor substrate; an insulating film formed between the control electrode and the semiconductor substrate; a gate stack formed on a side surface of the control electrode; a plurality of first insulating films formed as layers on a side surface of the gate stack; a plurality of second doping semiconductor areas formed as layers on a side surface of the gate stack; and a first doping semiconductor area formed on a portion of side surfaces of the first insulating films and the second doping semiconductor areas and formed on side surfaces facing each other in a first direction, wherein the first insulating films and the second doping semiconductor areas are alternately formed as layers on the side surface of the gate stack.

According to a second aspect of the present invention, there is provided a flash memory cell stack including: a semiconductor substrate; a control electrode formed in a vertical pillar shape on a surface of the semiconductor substrate; an insulating film formed between the control electrode and the semiconductor substrate; a gate stack formed on a side surface of the control electrode; a plurality of first insulating films formed as layers on a side surface of the gate stack; a plurality of second doping semiconductor areas formed as layers on a side surface of the gate stack a first doping semiconductor area formed on a first side surface of the first insulating films and the second doping semiconductor areas; and an isolation insulating film formed on a second side surface of the first insulating films and the second doping semiconductor areas facing the first side surface of the first insulating films and the second doping semiconductor areas, wherein the first insulating films and the second doping semiconductor areas are alternately formed as layers on the side surface of the gate stack.

According to a third aspect of the present invention, there is provided a flash memory cell stack including: a semiconductor substrate; a control electrode formed in a vertical pillar shape on a surface of the semiconductor substrate; an insulating film formed between the control electrode and the semiconductor substrate; a gate stack formed on first and second side surfaces of the control electrode, which face each other; a fourth insulating film formed on remaining side surfaces of the control electrode excluding the first and second side surfaces; a plurality of first insulating films formed as layers on a side surface of the gate stack facing the first and second side surfaces of the control electrode; a plurality of second doping semiconductor areas formed as layers on a side surface of the gate stack facing the first and second side surfaces of the control electrode; and a first doping semiconductor area formed on side surfaces of the first insulating films and the second doping semiconductor areas facing the first and second side surfaces of the control electrode, wherein the first insulating film and the second doping semiconductor areas are alternately formed as layers on the side surfaces of the gate stack.

In the flash memory cell stack according to the first to third aspects, it is preferable that a lower surface of the first doping semiconductor area is in contact with and electrically connected to the semiconductor substrate.

In the flash memory cell stack according to the first to third aspects, it is preferable that a well between the first doping semiconductor area and the semiconductor substrate is further included.

In the flash memory cell stack according to the first to third aspects, it is preferable that the gate stack is constructed with the tunneling insulating film, the charge storage node, and the blocking insulating film, constructed with the tunneling insulating film and the charge storage node, or constructed with the charge storage node and the blocking insulating film.

In the flash memory cell stack according to the first to third aspects, it is preferable that the charge storage node is formed on all the side surfaces of the control electrode or on only the portions where the control electrode and the second doping semiconductor area are overlapped with each other.

In the flash memory cell stack according to the first to third aspects, it is preferable that the first doping semiconductor area and the second doping semiconductor area are doped with opposite types of impurities.

In the flash memory cell stack according to the first to third aspects, it is preferable that the surface of the second doping semiconductor area contacting with the gate stack may be formed so that the central portion thereof in the direction parallel to the control electrode or in the direction intersecting the control electrode is protruded or so that the central portion in the area overlapped with the control electrode 6 is protruded.

In the flash memory cell stack according to the first to third aspects, it is preferable that the cell stack includes a plurality of the cell devices, and each of the cell devices includes the control electrode, the gate stack, the second doping semiconductor area, and the first doping semiconductor area; the cell device senses an amount of a current due to GIDL occurring in the second doping semiconductor area disposed on the side surface of the gate stack according to a state of program or erase and senses the state or degree of program or erase according to the amount of the sensed current; and the cell device is configured so that multiple levels of two bits or more can be stored in one cell by adjusting one or two or more among a program voltage, an erase voltage, a program time, and an erase time.

In the flash memory cell stack according to the first to third aspects, it is preferable that a junction between the second doping semiconductor area and the first doping semiconductor area is formed in an upper portion of the first insulating film.

According to a fourth aspect of the present invention, there is provided a flash memory cell stack string including a plurality of flash memory cell stacks arrayed in a row, in which each of the flash memory cell stacks includes a semiconductor substrate; a control electrode formed in a vertical pillar shape on a surface of the semiconductor substrate; an insulating film formed between the control electrode and the semiconductor substrate; a gate stack formed on a side surface of the control electrode; a plurality of first insulating films formed as layers on a side surface of the gate stack; a plurality of second doping semiconductor areas formed as layers on a side surface of the gate stack; and a first doping semiconductor area formed on a portion of side surfaces of the first insulating films and the second doping semiconductor areas and formed on side surfaces facing each other in a first direction, wherein the first insulating films and the second doping semiconductor areas are alternately formed as layers on a side surface of the gate stack, and wherein the second doping semiconductor areas of the cell stacks constituting the cell stack string are connected to each other in each layer, the first insulating films of the cell stacks are also connected to each other in each layer, and the first doping semiconductor area is connected to the side surfaces of the second doping semiconductor areas and the first insulating films.

According to a fifth aspect of the present invention, there is provided a flash memory cell stack string including a plurality of flash memory cell stacks arrayed in a row, in which each of the flash memory cell stacks includes a semiconductor substrate; a control electrode formed in a vertical pillar shape on a surface of the semiconductor substrate; an insulating film formed between the control electrode and the semiconductor substrate; a gate stack formed on a side surface of the control electrode; a plurality of first insulating films formed as layers on a side surface of the gate stack; a plurality of second doping semiconductor areas formed as layers on a side surface of the gate stack; a first doping semiconductor area formed on a first side surface of the first insulating films and the second doping semiconductor areas; and an isolation insulating film formed on a second side surface of the first insulating films and the second doping semiconductor areas facing the first side surface of the first insulating films and the second doping semiconductor areas; wherein the first insulating films and the second doping semiconductor areas are alternately formed as layers on a side surface of the gate stack, and wherein the second doping semiconductor areas of the cell stacks constituting the cell stack string are connected to each other in each layer, the first insulating films of the cell stacks are also connected to each other in each layer, and the first doping semiconductor area is connected to the side surfaces of the second doping semiconductor areas and the first insulating films.

According to a sixth aspect of the present invention, there is provided a flash memory cell stack string including a plurality of flash memory cell stacks arrayed in a row, in which each of the flash memory cell stacks includes a semiconductor substrate; a control electrode formed in a vertical pillar shape on a surface of the semiconductor substrate; an insulating film formed between the control electrode and the semiconductor substrate; a gate stack formed on first and second side surfaces of the control electrode, which face each other; a fourth insulating film formed on remaining side surfaces of the control electrode excluding the first and second side surfaces; a plurality of first insulating films formed as layers on a side surface of the gate stack facing the first and second side surfaces of the control electrode; a plurality of second doping semiconductor areas formed as layers on a side surface of the gate stack facing the first and second side surfaces of the control electrode; and a first doping semiconductor area formed on side surfaces of the first insulating films and the second doping semiconductor areas facing the first and second side surfaces of the control electrode, wherein the first insulating films and the second doping semiconductor areas are alternately formed as layers on a side surface of the gate stack, and wherein the second doping semiconductor areas of the cell stacks constituting the cell stack string are connected to each other in each layer, the first insulating films of the cell stacks are also connected to each other in each layer, and a fourth insulating film is disposed between the adjacent control electrodes.

In the flash memory cell stack string according to the fourth to sixth aspects, it is preferable that the first doping semiconductor area is in contact with and electrically connected to the semiconductor substrate.

In the flash memory cell stack string according to the fourth to sixth aspects, it is preferable that each of the flash memory cell stacks of the flash memory cell stack string further includes a well between the first doping semiconductor area and the semiconductor substrate.

In the flash memory cell stack string according to the fourth to sixth aspects, it is preferable that the control electrode is formed in a rectangular shape and the gate stack is formed to surround the control electrode, and the isolation insulating film is formed on one side surface of the four rectangular side surfaces, where the gate stack is formed, and formed to be connected between the adjacent cell stacks.

In the flash memory cell stack string according to the fourth to sixth aspects, it is preferable that the gate stack is not formed on one side surface of the four rectangular side surfaces of the control electrode and the isolation insulating film is formed on the side surface and formed to be connected between the adjacent cell stacks.

In the flash memory cell stack string according to the fourth to sixth aspects, it is preferable that the gate stack is constructed with the tunneling insulating film, the charge storage node, and the blocking insulating film, constructed with the tunneling insulating film and the charge storage node, or constructed with the charge storage node and the blocking insulating film.

In the flash memory cell stack string according to the fourth to sixth aspects, it is preferable that the charge storage node is formed on all the side surfaces of the control electrode or on only the portions where the control electrode and the second doping semiconductor area are overlapped with each other.

In the flash memory cell stack string according to the fourth to sixth aspects, it is preferable that the first doping semiconductor area and the second doping semiconductor area are doped with opposite types of impurities.

In the flash memory cell stack string according to the fourth to sixth aspects, it is preferable that each of the cell devices includes the control electrode, the gate stack, the second doping semiconductor area, and the first doping semiconductor area; the cell device senses an amount of a current due to GIDL occurring in the second doping semiconductor area 2 disposed on the side surface of the gate stack according to a state of program or erase and senses the state or degree of program or erase according to the amount of the sensed current; and the cell device is configured so that multiple levels of two bits or more can be stored in one cell by adjusting one or two or more among a program voltage, an erase voltage, a program time, and an erase time.

In the flash memory cell stack string according to the fourth to sixth aspects, it is preferable that the second doping semiconductor area formed as layers are formed as an L-shaped structure, a first contact window is formed on the upper surface of the L-shaped structure, and the first contact window is connected to metal interconnection.

According to a seventh aspect of the present invention, there is provided a cell stack array including a plurality of the flash memory cell stack strings arrayed in a row, each of the flash memory cell stack strings including a plurality of flash memory cell stacks arrayed in a row, in which each of the flash memory cell stacks includes a semiconductor substrate; a control electrode formed in a vertical pillar shape on a surface of the semiconductor substrate; an insulating film formed between the control electrode and the semiconductor substrate; a gate stack formed on a side surface of the control electrode; a plurality of first insulating films formed as layers on a side surface of the gate stack; a plurality of second doping semiconductor areas formed as layers on a side surface of the gate stack; and a first doping semiconductor area formed on a portion of side surfaces of the first insulating films and the second doping semiconductor areas and formed on side surfaces facing each other in a first direction, wherein the first insulating films and the second doping semiconductor areas are alternately formed as layers on a side surface of the gate stack, wherein the second doping semiconductor areas of the cell stacks constituting the cell stack string are connected to each other in each layer, the first insulating films of the cell stacks are also connected to each other in each layer, and the first doping semiconductor area is connected to the side surfaces of the second doping semiconductor areas and the first insulating films, and wherein the adjacent flash memory cell stack strings share the first doping semiconductor area or an isolation insulating film is further included between the first doping semiconductor areas of the adjacent flash memory cell stack strings.

According to an eighth aspect of the present invention, there is provided a cell stack array including a plurality of the flash memory cell stack strings arrayed in a row, each of the flash memory cell stack strings including a plurality of flash memory cell stacks arrayed in a row, in which each of the flash memory cell stacks includes a semiconductor substrate; a control electrode formed in a vertical pillar shape on a surface of the semiconductor substrate; an insulating film formed between the control electrode and the semiconductor substrate; a gate stack formed on first and second side surfaces of the control electrode, which face each other; a fourth insulating film formed on remaining side surfaces of the control electrode excluding the first and second side surfaces; a plurality of first insulating films formed as layers on a side surface of the gate stack facing the first and second side surfaces of the control electrode; a plurality of second doping semiconductor areas formed as layers on a side surface of the gate stack facing the first and second side surfaces of the control electrode; and a first doping semiconductor area formed on side surfaces of the first insulating films and the second doping semiconductor areas facing the first and second side surfaces of the control electrode, wherein the first insulating films and the second doping semiconductor areas are alternately formed as layers on a side surface of the gate stack, wherein the second doping semiconductor areas of the cell stacks constituting the cell stack string are connected to each other in each layer, the first insulating films of the cell stacks are also connected to each other in each layer, and a fourth insulating film is disposed between the adjacent control electrodes, and wherein the adjacent flash memory cell stack strings share the first doping semiconductor area or an isolation insulating film is further included between the first doping semiconductor areas of the adjacent flash memory cell stack strings.

According to a ninth aspect of the present invention, there is provided a cell stack array including a plurality of the flash memory cell stack strings arrayed in a row, each of the flash memory cell stack strings including a plurality of flash memory cell stacks arrayed in a row, in which each of the flash memory cell stacks includes a semiconductor substrate; a control electrode formed in a vertical pillar shape on a surface of the semiconductor substrate; an insulating film formed between the control electrode and the semiconductor substrate; a gate stack formed on a side surface of the control electrode; a plurality of first insulating films formed as layers on a side surface of the gate stack; a plurality of second doping semiconductor areas formed as layers on a side surface of the gate stack; a first doping semiconductor area formed on a first side surface of the first insulating films and the second doping semiconductor areas; and an isolation insulating film formed on a second side surface of the first insulating films and the second doping semiconductor areas facing the first side surface of the first insulating films and the second doping semiconductor areas, wherein the first insulating films and the second doping semiconductor areas are alternately formed as layers on a side surface of the gate stack, wherein the second doping semiconductor areas of the cell stacks constituting the cell stack string are connected to each other in each layer, the first insulating films of the cell stacks are also connected to each other in each layer, and the first doping semiconductor area is connected to the side surfaces of the second doping semiconductor areas and the first insulating films, and wherein the first doping semiconductor area or the isolation insulating film is disposed between the adjacent cell stack strings.

According to a tenth aspect of the present invention, there is provided a cell stack array including a plurality of the flash memory cell stack strings arrayed in a row, each of the flash memory cell stack strings including a plurality of flash memory cell stacks arrayed in a row, in which each of the flash memory cell stacks includes a semiconductor substrate; a control electrode formed in a vertical pillar shape on a surface of the semiconductor substrate; an insulating film formed between the control electrode and the semiconductor substrate; a gate stack formed on a side surface of the control electrode; an isolation insulating film formed on a first side surface of the gate stack; a plurality of first insulating films formed as layers on a remaining side surface of the gate stack excluding the first side surfaces; a plurality of second doping semiconductor areas formed as layers on remaining side surfaces of the gate stack excluding the first side surface; and a first doping semiconductor area formed on side surfaces of the first insulating films and the second doping semiconductor areas facing the first side surface of the gate stack, wherein the first insulating films and the second doping semiconductor areas are alternately formed as layers on a side surface of the gate stack, wherein the second doping semiconductor areas of the cell stacks constituting the cell stack string are connected to each other in each layer, the first insulating films of the cell stacks are also connected to each other in each layer, and the first doping semiconductor area is connected to the side surfaces of the second doping semiconductor areas and the first insulating films, and wherein the isolation insulating films of the adjacent flash memory cell stack strings are connected to each other, and the first doping semiconductor areas are also connected to each other, and the adjacent flash memory cell stack strings share the first doping semiconductor area or the isolation insulating film.

In the cell stack array according to the ninth aspect, the gate stack is not formed between the control electrode and the isolation insulating film.

In the cell stack array according to the seventh to tenth aspects, it is preferable that the cell stack string is configured so that the second doping semiconductor area formed as layers are formed as a L-shaped structure, a first contact window is formed on the upper surface of the L-shaped structure, and the first contact window is connected to metal interconnection.

In the cell stack array according to the seventh to tenth aspects, it is preferable that the cell stack array and MOS devices as peripheral circuits are integrated in the same semiconductor substrate.

According to an eleventh aspect of the present invention, there is provided a method of fabricating a flash memory cell stack array, including steps of: (a) alternately forming a sacrifice semiconductor layer and a second doping semiconductor area in a semiconductor substrate; (b) forming a mask pattern in a predetermined area of the resulting product of (a) and performing etching and, after that, forming a gate stack on an internal surface of the etched area; (c) forming a control electrode in the etched area where the gate electrode is formed; (d) forming a mask pattern and etching a portion of the sacrifice semiconductor layer and a portion of the second doping semiconductor area; (e) selectively etching the sacrifice semiconductor layer and forming a first insulating film in an area where the sacrifice semiconductor layer is etched; (f) forming a first doping semiconductor area on a side surface of the second doping semiconductor area, wherein the first doping semiconductor area and the second doping semiconductor area are doped with different semiconductor types.

In the method according to the above aspect, it is preferable that the step (a) includes steps of (a1) forming a fifth insulating film on the surface of the semiconductor substrate and forming a mask pattern; (a2) etching the semiconductor substrate so that a portion of the semiconductor substrate under the fifth insulating film is etched in an "undercut" shape; and (a3) alternately growing an L-shaped sacrifice semiconductor layer and the L-shaped second doping semiconductor area on the surface of the etched semiconductor substrate.

In the method according to the above aspect, it is preferable that in the step (b), the etching is performed in a trench shape; and in the step (c), an area which is etched in the trench shape is filled with a control electrode material, an area excluding the control electrode is selectively etched, and after that, the etched area is filled with a fourth insulating film.

In the method according to the above aspect, it is preferable that in the step (e), the selectively etching the sacrifice semiconductor layer further includes selectively etching a portion of or the entire portions of the gate stack which is exposed by the selectively etching of the sacrifice semiconductor layer.

Since a cell device according to the present invention is formed so as to have a simple diode structure unlike an existing MOS transistor structure and a cell stack is formed by stacking the cell devices in a three-dimensional structure, it is possible to increase integration density.

In the cell devices of the cell stack according to the present invention, an amount of current can be changed up to about 10,000 times by adjusting an amount of stored charges, so that it is possible to implement a multi-level cell (MLC).

In addition to the above advantages, the following advantages can be obtained.

Firstly, in an existing MOS transistor type cell device, the fabricating processes thereof are very difficult as the miniaturization proceeds. However, in the diode type cell device according to the present invention, the structure is simple, so that the fabricating processes are simple.

Secondly, in comparison with the existing MOS transistor type cell device, the processes for forming elements of the cell device according to the present invention are simple and a change in characteristics is small, so that the dispersion of characteristics of the device is relatively small.

Thirdly, in the read operation for a specific cell device, no pass voltage or a low pass voltage may be applied to other cell devices, so that the read disturb problem does not occur.

BRIEF DESCRIPTION OF THE DRAWINGS

FIG. 1a is a cross-sectional view of a flash memory cell device according to a first embodiment of the present invention in a direction intersecting a control electrode 6, and FIG. 1b is an equivalent circuit diagram illustrating a symbol of the cell device illustrated in FIG. 1a.

FIGS. 7a-8b, 9, and 10a-10b are plan views illustrating various modified examples of a cell stack array formed by arraying the flash memory cell stacks or the flash memory cell stack strings illustrated in FIGS. 5a, 5b, 6a and 6b. Areas indicated by broken lines correspond to the plan views of the structures illustrated in FIGS. 5a, 5b, 6a and 6b.

FIG. 15a is a plan view illustrating a state of a cell stack after a third insulating film 19 is formed in the cell stack illustrated in FIG. 11 and, after that, a contact window (contact hole) for connection to metal interconnection is formed, and FIG. 15b is a cross-sectional view taken in the X-X direction of FIG. 15a.

FIG. 16a-16f is cross-sectional views sequentially illustrating an example of fabricating processes for implementing a flash memory cell stack and a flash memory cell stack string using the flash memory cell stacks according to the present invention illustrated in FIG. 11a.

FIG. 17a-17b illustrates main processes performed before an epitaxial layer growing process of alternately growing sacrifice semiconductor layers 21 and second doping semiconductor areas 2 as described in FIG. 16a.

DETAILED DESCRIPTION OF THE INVENTION

Hereinafter, structures and operations of flash memory cell stacks and the cell stack strings and fabricating methods thereof according to preferred embodiments of the present invention will be described in detail with reference to the accompanying drawings. For the convenience of description and the better understanding in the accompanying drawings, the vertically-formed cell stacks are illustrated with the upper portions thereof being removed, and in some figures, control electrodes 6 or gate electrodes 16 of MOS devices are illustrated with the upper portions thereof being cut.

First Embodiment

Figure 1:
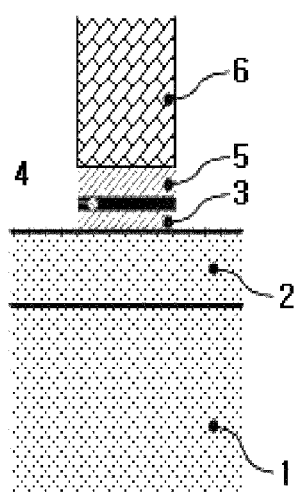
Figure 1:
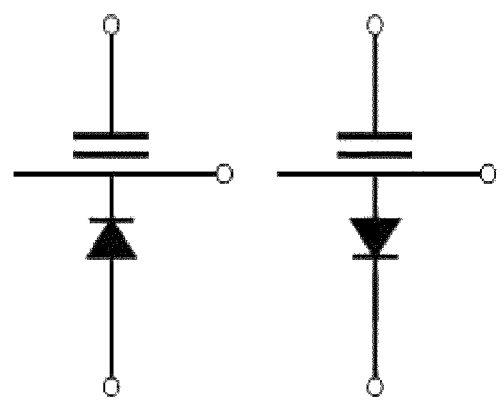
Figure 2:
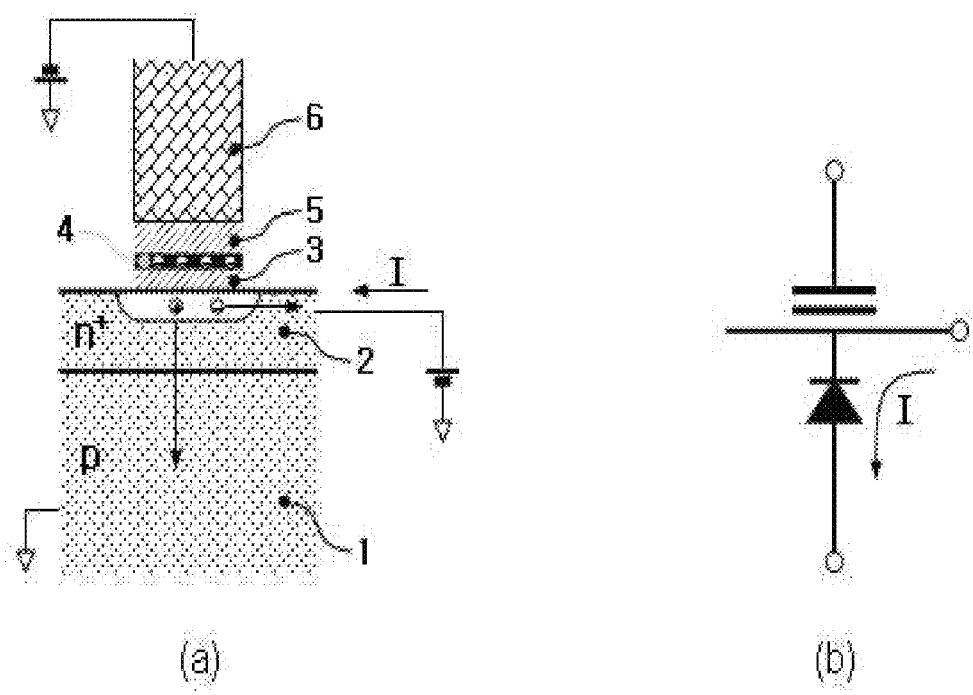
FIG. 2a-2b is a cross-sectional view of the flash memory cell device according to the first embodiment of the present invention and an equivalent circuit diagram thereof for explaining a principle and direction of current flow between first and second doping semiconductor areas in the cell device during a reading operation.

Now, a structure and operations of a flash memory cell device according to a first embodiment of the present invention are described with reference to FIGS. 1 and 2. FIG. 1a is a cross-sectional view illustrating the flash memory cell device in a direction intersecting the control electrode 6. Referring to FIG. 1a, the flash memory cell device according to the first embodiment of the present invention includes a first doping semiconductor area 1 which is formed on a semiconductor substrate, a first doping semiconductor area 2 which is formed on the first doping semiconductor area, a tunneling insulating film 3 which is formed on the second doping semiconductor area, and a charge storage node 4, a control insulating film 5, and a control electrode 6 which are sequentially formed on the tunneling insulating film. Herein, the first doping semiconductor area 1 and the second doping semiconductor area 2 need to be different from each other in the semiconductor type of doped impurities. In addition, it is preferable that the doping concentration of the second doping semiconductor area is higher than that of the first doping semiconductor area.

One of the important features of the cell device is that there is no source/drain and no channel is formed unlike an conventional MOS transistor based cell device. With respect to an conventional MOS transistor type cell device, the fabricating processes are gradually difficult as the miniaturization proceeds, and thus, the dispersion of characteristics of the cell device tends to be increased. FIG. 1b is an equivalent circuit diagram illustrating a symbol of the cell device illustrated in FIG. 1a. In the left portion of FIG. 1b, the first doping semiconductor area 1 is of a p type, and the second doping semiconductor area 2 is of an n type. In the right portion of FIG. 1b, the semiconductor types are opposite to those of the left portion of FIG. 1b.

Now, the operations of the flash memory cell device of FIG. 1 are described with reference to FIG. 2. FIG. 2 is a cross-sectional view for explaining the operations of the cell device of FIG. 1. FIG. 2 explains a principle and direction of current flow between the first and second doping semiconductor areas in the cell device during a reading operation. For example, it is assumed that the first doping semiconductor area 1 is of a p type and the second doping semiconductor area 2 is of an n+ type. If a negative voltage is applied to the control electrode 6 and a positive voltage is applied to the second doping semiconductor area, electron-hole pairs (Electron-Hole Pairs; EHPs) are generated on the surface of the n+ semiconductor area, which is in contact with the tunneling insulating film 3, due to band-to-band tunneling. The generated electrons are moved to the second doping semiconductor area 2 to which a positive voltage is applied, and the generated holes are diffused as minority carriers to be moved to the first doping semiconductor area 1. As a result, the current is flowed as illustrated in FIG. 2. In the state where positive charges exist or no negative charge exists in the charge storage node 4, a very small number of the electron-hole pairs exist in the surface area, so that a small amount of the current is flowed. However, if negative charges are stored in the charge storage node through the program operation, much more number of the electron-hole pairs is generated during the reading operation. In this case, since much more amount of the current is flowed, this state can be more easily distinguished from the state where charges are erased. A memory cell can be configured by using this principle.

Figure 3:
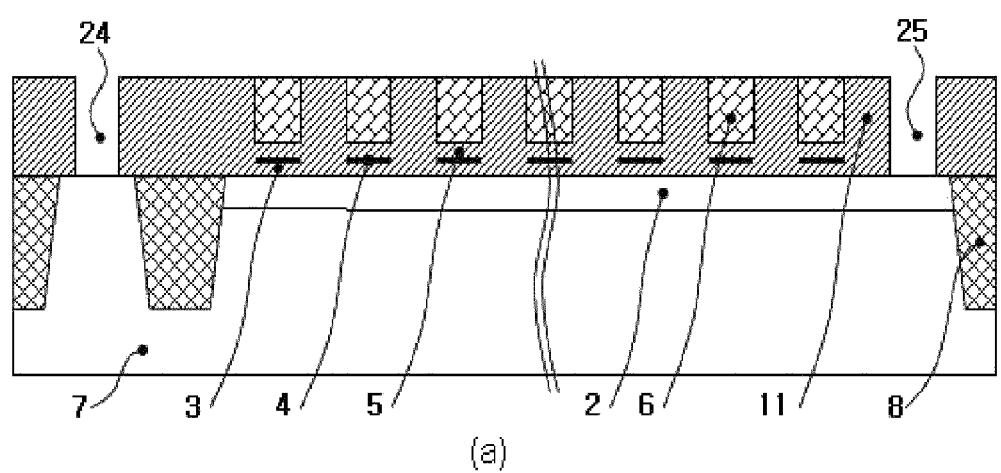
FIG. 3a-3b is a cross-sectional view and an equivalent circuit diagram of a cell string configured with the flash memory cell devices according to the first embodiment of the present invention.
Figure 3:
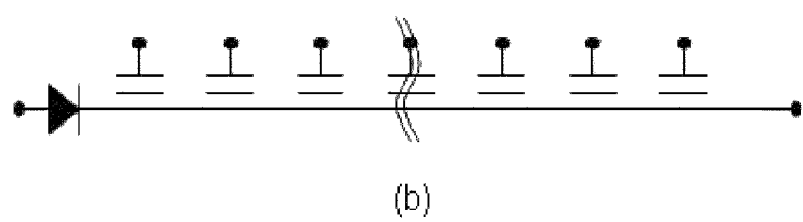

Now, a structure and operations of the cell string implemented by using the flash memory cell device of FIG. 1 are described. FIG. 3 is a cross-sectional view and an equivalent circuit diagram illustrating an example of the cell string configured with the cell devices illustrated in FIG. 1. FIG. 3b illustrates a symbol of the cell string. The direction of the diode illustrated in the left side of the symbol is arbitrarily illustrated. If the doping types of the first and second doping semiconductor areas are changed, the direction of the diode may be changed. Referring to FIG. 3, the cell string is configured so that the flash memory cell devices, each of which includes a first doping semiconductor area 1 formed on a semiconductor substrate, a second doping semiconductor area 2 formed on the first doping semiconductor area, a tunneling insulating film 3 formed on the second doping semiconductor area, and a charge storage node 4, a blocking insulating film 5, and a control electrode 6 sequentially formed on the tunneling insulating film, are disposed in a row. Herein, since the first doping semiconductor area 1 is doped with impurities of the same semiconductor type as that of the semiconductor substrate 7, the first doping semiconductor area 1 is not distinguishably illustrated from the semiconductor substrate 7 in FIG. 3.

Figure 4:
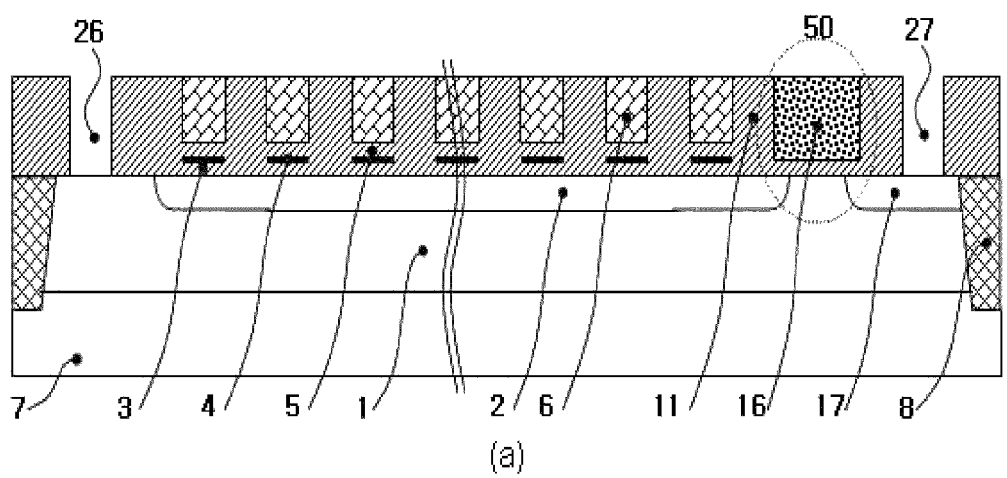
FIG. 4a-4b is a cross-sectional view and an equivalent circuit diagram of another example of the cell string configured with the flash memory cell devices according to the first embodiment of the present invention.
Figure 4:
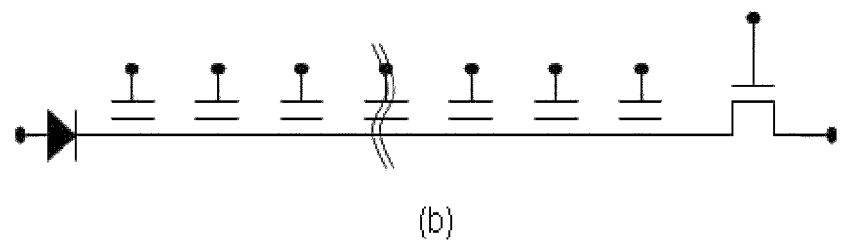

The cell string includes a second insulating film 11 which is formed between the control electrodes 6 of the cell devices, so that the control electrodes of the cell devices are electrically separated from each other. In the cell string, the first doping semiconductor areas 1 of the cell devices are connected to each other; the second doping semiconductor areas 2 of the cell devices are also connected to each other; and the cell string includes contact windows for electrical contact with the connected first doping semiconductor areas and the connected second doping semiconductor areas. In the cell string, the electrical contact window 25 of the second doping semiconductor areas is formed at the right end portion of the cell string. The electrical contact window 24 of the first doping semiconductor areas 1 is formed at the right end portion on the surface of the semiconductor substrate. Herein, the first doping semiconductor area 1 is doped with impurities of the same semiconductor type as that of the semiconductor substrate 7, and the electrical contact of the first doping semiconductor area is shared as a substrate contact FIG. 4 is a cross-sectional view and an equivalent circuit diagram of another example of the cell string configured with flash memory cell devices, wherein the cell string is configured with cell devices and switching devices. Referring to FIG. 4a, the cell string includes a plurality of cell devices which are arrayed in a row and one or two or more switching devices 50 which are connected to the two ends of the connected cell devices, and control electrodes 6 of the cell devices are separated from each other by a second insulating film 11. In FIG. 4, a switching device is formed at one end portion of the cell string. Each of the cell devices includes a first doping semiconductor area 1 formed on a semiconductor substrate 7, a second doping semiconductor area 2 formed on the first doping semiconductor area, a tunneling insulating film 3 formed on the second doping semiconductor area, and a charge storage node 4, a blocking insulating film 5, and a control electrode 6 which sequentially formed on the tunneling insulating film. The switching device includes the first doping semiconductor area 1 formed on the semiconductor substrate 7, a gate insulating film, a gate electrode 16, and a source or drain 17. In the switching device, an electrical contact window 27 may be formed to the source or drain 17 at the side of the switching device, which is not connected to the cell device, and an electrode may be formed thereon. In addition, an electrical contact window 26 may be formed at one side of the connected first doping semiconductor area, and an electrode may be formed thereon. FIG. 4b is an equivalent circuit diagram of the cell string structure illustrated in FIG. 4a, wherein the direction of the diode is also arbitrarily illustrated.

MODE FOR INVENTION

Second Embodiment

Flash Memory Cell Stack and Cell String

Now, structures of a flash memory cell stack and a flash memory cell stack string using the flash memory cell stack according to a second embodiment of the present invention will be described with reference to the accompanying drawings. Hereinafter, the structures of the cell stack and the cell stack string according to the second embodiment of the present invention are described with reference to FIG. 5a. In the specification, the term "cell stack" denotes that cell devices are vertically stacked, and the term "cell stack string" denotes that the cell stacks are arrayed in a row. In order to clarify the main portions of the structures, all the upper structures of the cell stack and the cell stack string are removed in the illustration. FIGS. 5a and 5b illustrate a portion of the cell stack string, and a rectangular area indicated by a broken line on the upper portion of the figures denotes the cell stack.

Referring to FIG. 5a, the cell stack according to the second embodiment of the present invention includes a semiconductor substrate 7, a control electrode 6 formed on a surface of the semiconductor substrate, an insulating film 31 formed between the control electrode and the semiconductor substrate, a gate stack (3, 4, 5) formed on a side surface of the control electrode, a plurality of the first insulating films 9 formed as layers on a side surface of the gate stack, a plurality of the second doping semiconductor areas 2 formed as layers on a side surface of the gate stack, and a first doping semiconductor area 1 formed on a y-axis side surface of the first insulating films and the second doping semiconductor areas. The first insulating films and the second doping semiconductor areas are alternately formed as layers on the side surface of the gate stack. The insulating film 31 is formed between the semiconductor substrate 7 and the control electrode 6. The insulating film 31 may be formed in the same manner as that of the gate stack (3, 4, 5). In FIG. 5a, a lower surface of the first doping semiconductor area 1 is in contact with and electrically connected to the semiconductor substrate 7.

FIG. 5b illustrates a modified example of the flash memory cell stack according to the second embodiment, in which a well 12 between the semiconductor substrate 7 and the first doping semiconductor area 1 is further included. The first doping semiconductor area 1 is formed on the well 12. The well 12 is doped with the semiconductor type opposite to that of the first doping semiconductor area 1. The first doping semiconductor area 1 and the semiconductor substrate 7 are electrically separated from each other by the well 12.

In the cell stack, the gate stack includes the tunneling insulating film 3, the charge storage node 4, and the blocking insulating film 5. Alternatively, the gate stack may include the tunneling insulating film 3 and the charge storage node 4. Otherwise, the gate stack may include the charge storage node 4 and the blocking insulating film 5

The charge storage node 4 is formed on all the side surfaces of the control electrode 6. Alternatively, the charge storage node 4 may be formed on only the portions where the control electrode 6 and the second doping semiconductor area 2 are overlapped with each other.

The tunneling insulating film 3 may be formed as one layer or a plurality of layers. In the case where the tunneling insulating film is formed as a plurality of layers, the adjacent layers may be made of materials having different band gaps.

The blocking insulating film 5 of the gate stack may be formed as one layer or a plurality of layers. In the case where the blocking insulating film is formed as a plurality of layers, the adjacent layers may be made of materials having different band gaps.

The charge storage node 4 may be formed as a conductive film made of a conductive material, as an insulating film made of an insulating material, as an insulating nano-sized dot or a nano-sized crystal, as a combination of an insulating film and a nano-sized dot. In the case where the charge storage node 4 is formed as a conductive film, the conductive film includes one or two or more among a semiconductor, a metal, a metal nitride film, a multi-element metal, and a silicide. In the case where the charge storage node is formed as an insulating film, the insulating film includes one or two or more among a nitride film and a metal oxide film. In the case where the charge storage node is formed as a nano-sized dot, the dot includes one or more among a semiconductor material, a metal oxide, a metal, a metal nitride, and a silicide material.

The control electrode 6 of the cell stack may be constructed with one or two or more combinations among highly-doped Si, poly Si, Ge, poly Ge, SiGe, poly SiGe, amorphous Si, amorphous Ge, amorphous SiGe, a metal nitride, a metal, and a silicide. Each of the cell devices of the flash memory cell stack includes the control electrode 6, the gate stack (3, 4, 5), the second doping semiconductor area 2, and the first doping semiconductor area 1.

The first doping semiconductor area 1 and the second doping semiconductor area 2 are doped with opposite types of impurities. For example, in the case where the first doping semiconductor area 1 is a p type semiconductor, the second doping semiconductor area 2 is an n type semiconductor, and in the case where the first doping semiconductor area 1 is an n type semiconductor, the second doping semiconductor area 2 is a p type semiconductor.

The surface of the second doping semiconductor area 2 contacting with the gate stack may be formed so that the central portion thereof in the direction parallel to the control electrode 6 or in the direction intersecting the control electrode 6 is protruded or so that the central portion in the area overlapped with the control electrode 6 is protruded.

The cell stack includes a plurality of the cell devices. Each of the cell devices includes the control electrode 6, the gate stack, the second doping semiconductor area 2, and the first doping semiconductor area 1. The cell device senses an amount of a current due to GIDL (Gate Induced Drain Leakage) occurring in the second doping semiconductor area 2 disposed on the side surface of the gate stack according to a state of program or erase and senses the state or degree of program or erase according to the amount of the sensed current. In each of the cell devices of the flash memory cell stack, multiple levels of two bits or more can be stored in one cell by adjusting one or two or more among a program voltage, an erase voltage, a program time, and an erase time.

It is preferable that a junction occurring between the second doping semiconductor area 2 and the first doping semiconductor area 1 is formed in an upper portion of the first insulating film 9

Figure 5:
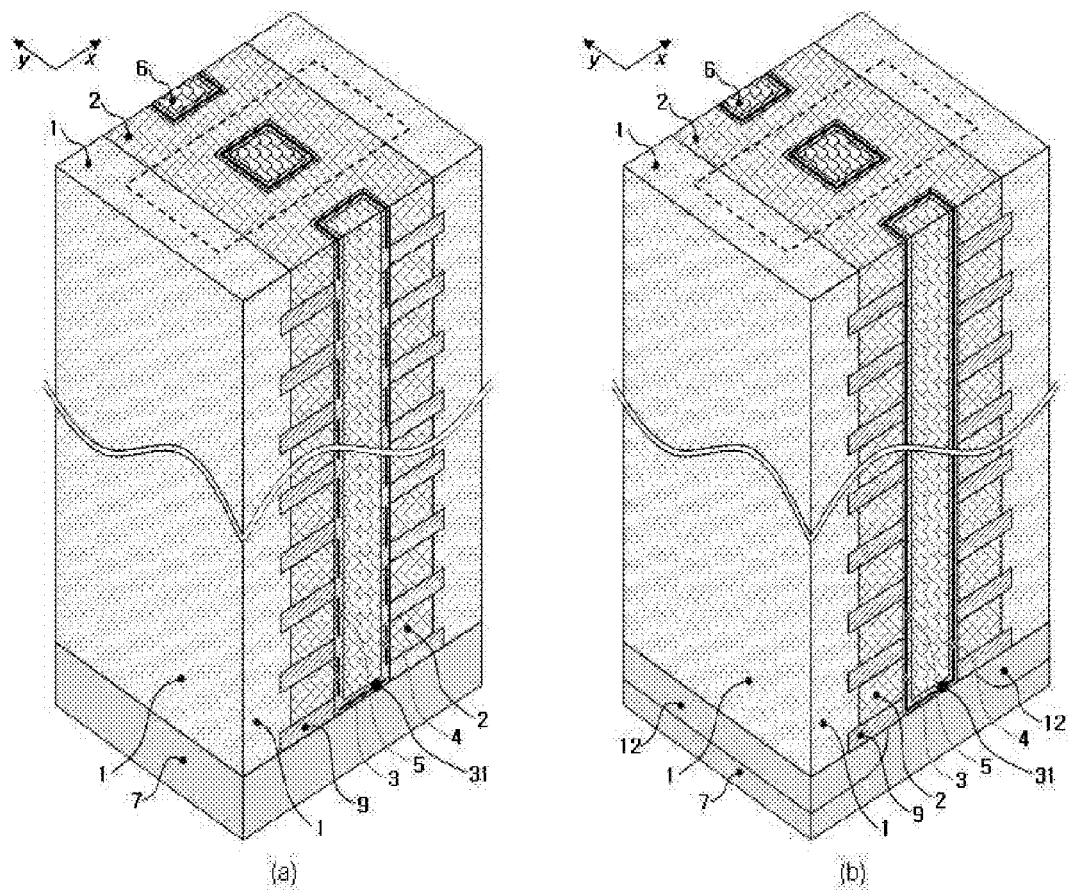
FIG. 5a and FIG. 5b are three-dimensional perspective views partially illustrating a modified example of a flash memory cell stack string according to a second embodiment of the present invention.

The flash memory cell stack string can be implemented by arraying the flash memory cell stacks in a row. FIG. 5 illustrates a portion of the cell stack string. In the flash memory cell stack string constructed with a plurality of the flash memory cell stacks which are arrayed in a row, the second doping semiconductor areas 2 of the cell stacks are connected to each other in each layer; the first insulating films 9 are also connected to each other in each layer; and the first doping semiconductor area 1 is formed so as to be connected to the side surfaces of the second doping semiconductor areas 2 and the first insulating films 9

In the cell stack string, there are two y-axis side surfaces of the first insulating film 9 and the second doping semiconductor area 2. The first doping semiconductor area 1 is formed on the one side surface, and the isolation insulating film 8 is formed on the other side surface.

In the cell stack string, the first doping semiconductor area 1 is in contact with and electrically connected to the semiconductor substrate 7.

In the cell stack string, a well 12 may be further included between the first doping semiconductor area 1 and the semiconductor substrate 7. In the flash memory cell stack string, the well 12 of each of the cell stacks is connected to the wells of the adjacent cell stacks.

The cell stack string can be modified as follows. In the cell stack string, the control electrode 6 is formed in a rectangular shape, and the gate stack is formed to surround the control electrode. The isolation insulating film 8 is formed on one side surface of the rectangular side surfaces, where the gate stack is formed, and formed to be connected between the adjacent cell stacks.

In addition, the cell stack string may be modified as follows. In the cell stack string, the gate stack may not be formed on one side surface of the rectangular side surfaces of the control electrode 6, and the isolation insulating film 8 may be formed on the side surface and formed to be connected between the adjacent cell stacks.

The cell stack string is constructed with a plurality of the cell stacks. The description on the cell stack is the same as described above.

Third Embodiment

Flash Memory Cell Stack and Cell String

Figure 6:
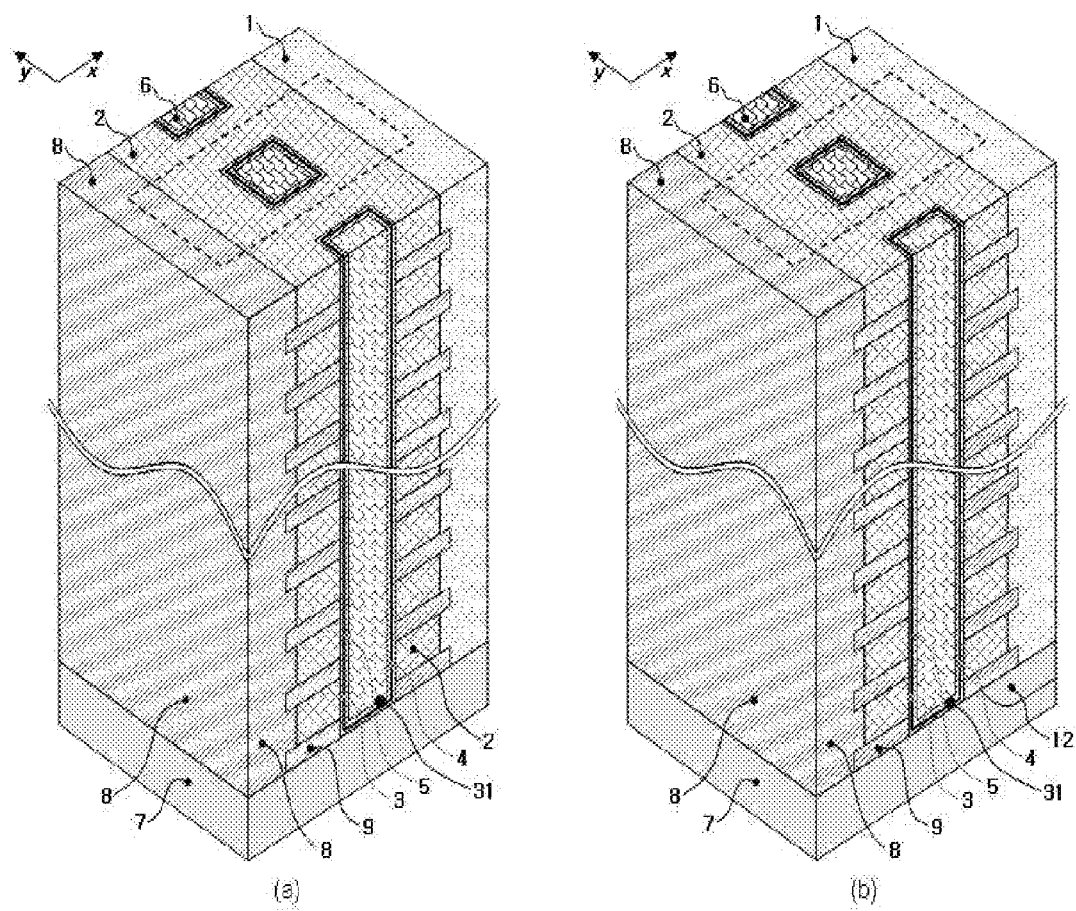
FIG. 6a and FIG. 6b are three-dimensional perspective views partially illustrating a modified example of a flash memory cell stack string according to a third embodiment of the present invention.

Now, structures of a flash memory cell stack and a flash memory cell stack string using the flash memory cell stack according to a third embodiment of the present invention will be described with reference to FIG. 6. FIG. 6*a* is a perspective view illustrating the flash memory cell stack according to the third embodiment, and FIG. 6*b* is a perspective view illustrating a modified example of the third embodiment. FIGS. 6*a* and 6*b* illustrate a portion of the cell stack string, and the rectangular areas indicated by the broken lines in the upper portions of the figures illustrate the cell stacks. Sine the third embodiment is similar to the second embodiment, redundant description is omitted, and only the different configurations are described.

Referring to FIG. 6*a*, a flash memory cell stack according to the third embodiment of the present invention includes a semiconductor substrate 7, a control electrode 6 formed in a vertical pillar shape on a surface of the semiconductor substrate, an insulating film 31 formed between the control electrode and the semiconductor substrate, a gate stack (3, 4, 5) formed on a side surface of the control electrode, a plurality of first insulating films 9 formed as layers on a side surface of the gate stack, a plurality of second doping semiconductor areas 2 formed as layers on a side surface of the gate stack, a first doping semiconductor area 1, and an isolation insulating film 8. The first insulating films and the second doping semiconductor areas are alternately formed as layers on the side surface of the gate stack. The insulating film 31 is formed between the semiconductor substrate 7 and the control electrode 6. The insulating film 31 may be formed in the same manner as that of the gate stack (3, 4, 5).

The first doping semiconductor area 1 is formed on a y-axis first side surface of the first insulating film and the second doping semiconductor area. The isolation insulating film 8 is formed on a second side surface of the first insulating films and the second doping semiconductor areas facing the first side surface of the first insulating films and the second doping semiconductor areas. The first insulating films and the second doping semiconductor areas are alternately formed as layers on the side surface of the gate stack.

In the flash memory cell stack string configured with the flash memory cell stacks having the aforementioned structure, a plurality of the flash memory cell stacks are arrayed in a row. Each of the cell stacks of the cell stack string includes two y-axis side surfaces of the first insulating film and the second doping semiconductor area. The first doping semiconductor area is formed on the one side surface, and the isolation insulating film is formed on the other side surface.

In the cell stack string implemented by arraying the cell stacks in a row, the second doping semiconductor areas of the cell stacks may be connected to each other in each layer; the first insulating films may also be connected to each other in each layer; the first doping semiconductor area may be connected to the one side surface of the y-axis side surfaces of the second doping semiconductor areas and the first insulating films; and the isolation insulating film may be connected to the other side surface of the y-axis side surfaces of the second doping semiconductor areas and the first insulating films.

In FIG. 6*a*, a lower surface of the first doping semiconductor area 1 is in contact with and electrically connected to the semiconductor substrate 7.

FIG. 6*b* illustrates a modified example of the flash memory cell stack according to the third embodiment, in which a well 12 is between the semiconductor substrate 7 and the first doping semiconductor area 1 further included. The first doping semiconductor area is formed on the well 12. The well 12 is doped with the semiconductor type opposite to that of the first doping semiconductor area 1. The first doping semiconductor area 1 and the semiconductor substrate 7 are electrically separated from each other by the well 12. In the flash memory cell stack string using the modified cell stack, the well 12 of each of the cell stacks is connected to the wells of the adjacent cell stacks.

In the flash memory cell stacks or the cell stack strings according to the second and third embodiments, the first doping semiconductor area 1 may be electrically connected to the semiconductor substrate 7. Alternatively, the first doping semiconductor area may be formed on the upper portion of the well 12 formed on the semiconductor substrate, and the first doping semiconductor area and the semiconductor substrate may be electrically separated from each other.

Structure of Cell Stack Array

Figure 7:
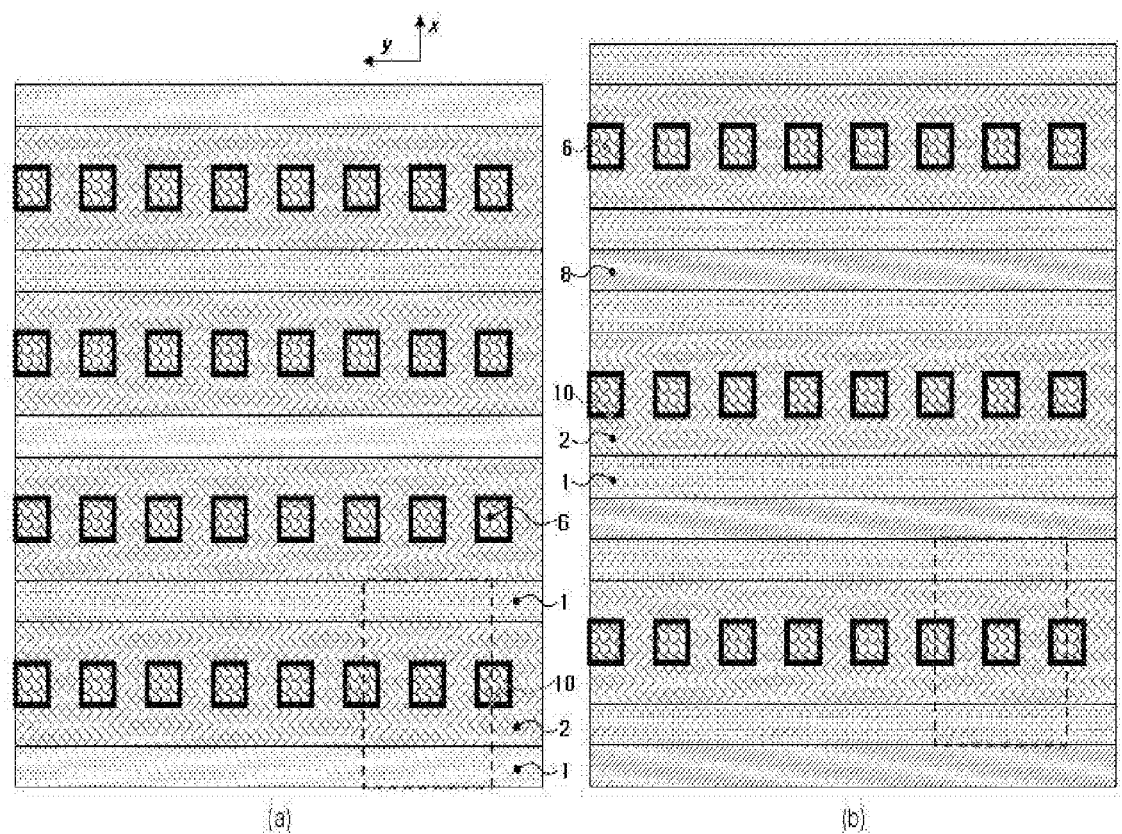

A cell stack array may be implemented by arraying the flash memory cell stack strings, each of which is constructed by arraying the flash memory cell stacks according to the second or third embodiment in a row, in the left/right direction. FIG. 7 is plan views illustrating an example of a cell array implemented by using the cell stacks or the cell stack strings according to the second embodiment of the present invention. The cell stacks are arrayed in the y axis direction to constitute each of the cell stack strings, and the cell stack strings are arrayed in the x axis direction to constitute the cell array. The rectangular areas indicated by the broken lines in the lower right portions of FIGS. 7a and 7b correspond to the plan views of the three-dimensional perspective views illustrated in FIG. 5.

The cell stack array includes a plurality of the flash memory cell stack strings arrayed in a row, and each of the flash memory cell stack strings includes a plurality of the flash memory cell stacks arrayed in a row. The flash memory cell stack and the flash memory cell stack string are the same as those of the aforementioned second or third embodiment.

In the cell stack array, the first doping semiconductor area 1 of the adjacent flash memory cell stack strings is shared, or the isolation insulating film 8 formed between the first doping semiconductor areas of the adjacent flash memory cell stack strings is shared. FIG. 7a is a plan view illustrating the cell stack array where the first doping semiconductor area 1 is disposed to be shared. FIG. 7b is a plan view illustrating the cell stack array where the isolation insulating film 8 formed between the first doping semiconductor areas of the adjacent flash memory cell stack strings is disposed to be shared.

Figure 8:
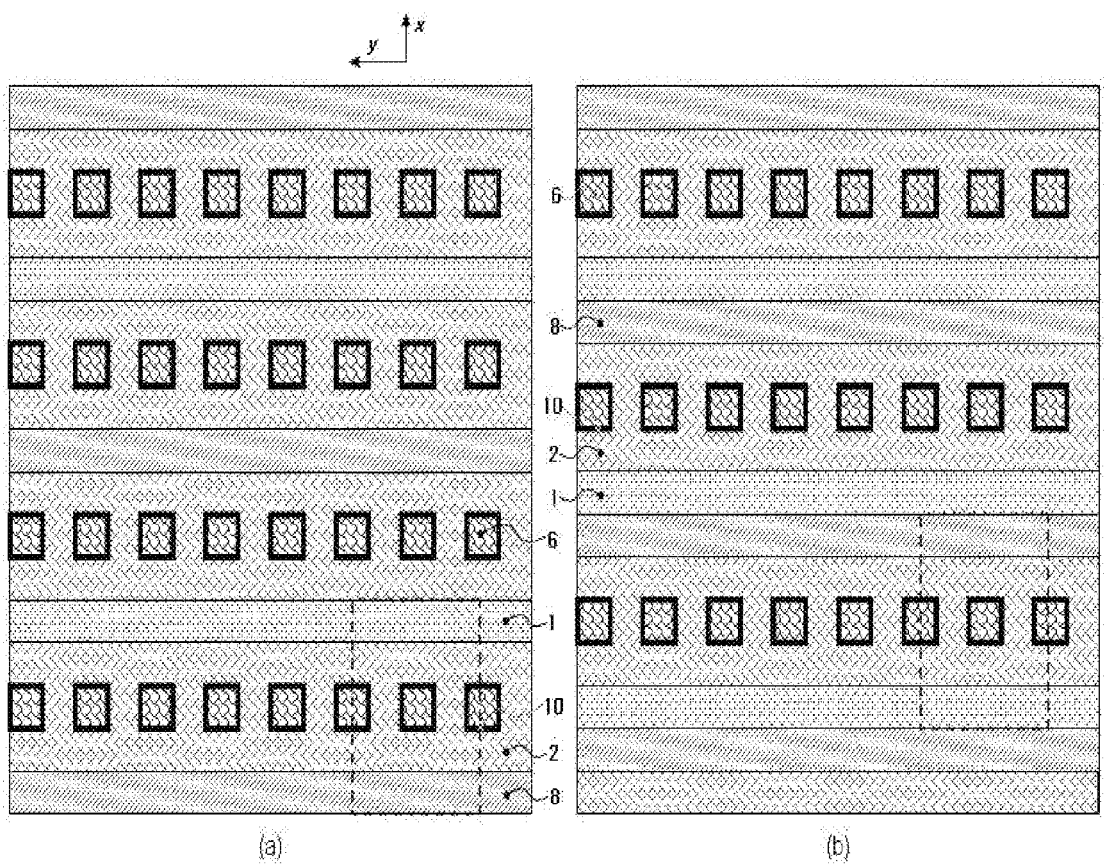

Referring to FIG. 8a, the cell stack array is implemented by arraying the cell stack strings where the first doping semiconductor area 1 is formed on the one side surface of the two y-axis side surfaces of the second doping semiconductor area 2 and the isolation insulating film 8 and the isolation insulating film 8 is formed on the other side surface. Herein, the first doping semiconductor area 1 or the isolation insulating film 8 of each cell stack string is disposed to be shared with the adjacent cell stack string.

Referring to FIG. 8b, the cell stack army is implemented by arraying the cell stack strings where the first doping semiconductor area 1 is formed on the one side surface of the two y-axis side surfaces of the second doping semiconductor area 2 and the isolation insulating film 8 and the isolation insulating film 8 is formed on the other side surface. Herein, the first doping semiconductor area of each other the cell stack strings is disposed so as to be in contact with the isolation insulating film 8 of the adjacent cell stack string.

Figure 9:
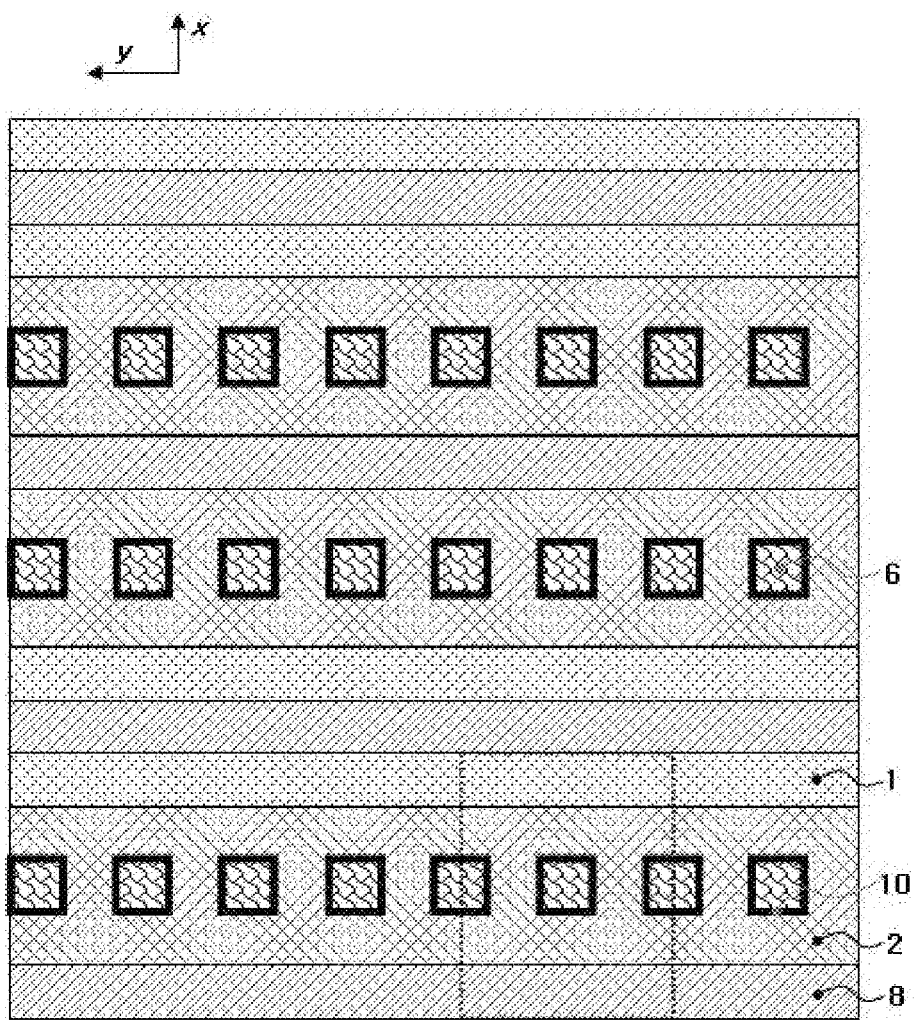
Figure 10:
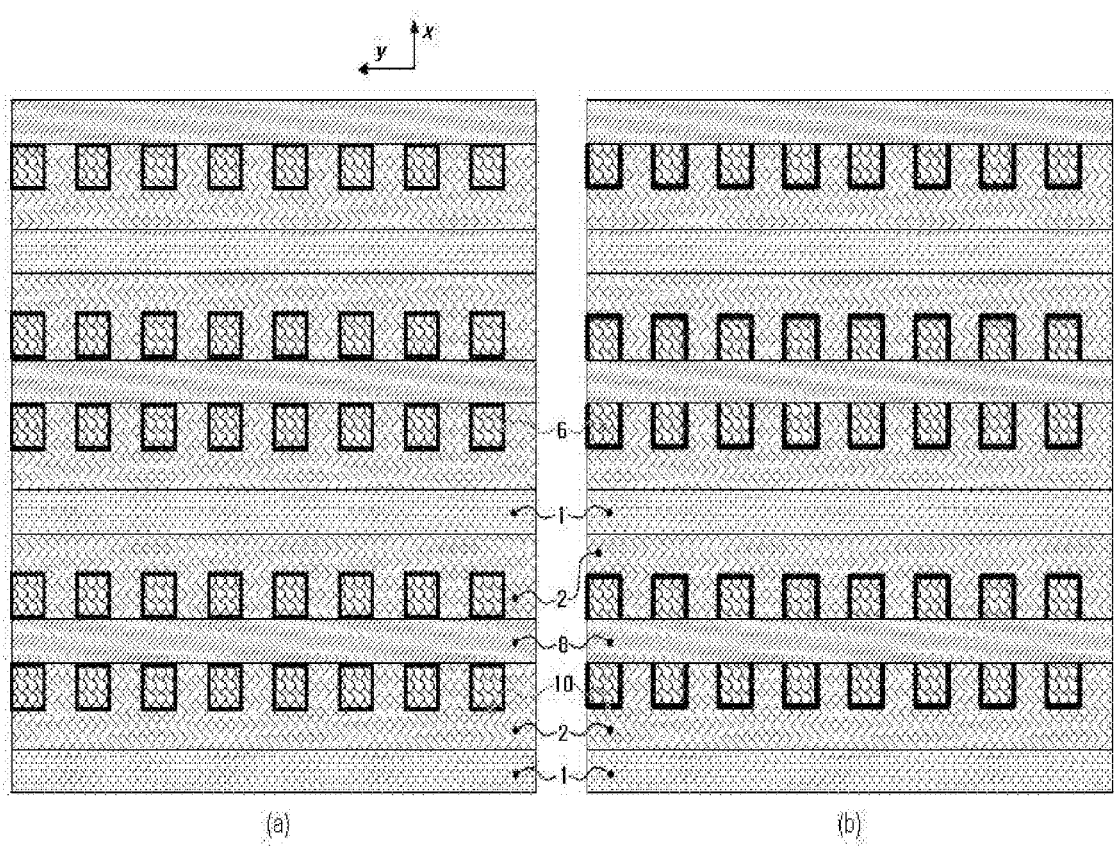

Referring to FIG. 9, the cell stack array is implemented by arraying the cell stack strings where the first doping semiconductor area 1 is formed on the one side surface of the two y-axis side surfaces of the second doping semiconductor area 2 and the isolation insulating film 8 and the isolation insulating film 8 is formed on the other side surface. Herein, each of the cell stack strings further includes the isolation insulating film 8 on the one side surface of the first doping semiconductor area 1, and the isolation insulating film 8 is disposed so as to be shared by two adjacent cell stack strings, Referring to FIG. 10a, in the cell stack array, the control electrode 6 of each the flash memory cell stacks has a rectangular shape and the gate stack is formed to surround the control electrode. The isolation insulating film 8 is formed on one of the four rectangular side surfaces where the gate stack is formed. The isolation insulating film 8 is formed to be connected to the isolation insulating film 8 of the adjacent cell stack. The adjacent cell stack strings are disposed so as to share the isolation insulating film 8 or the first doping semiconductor area 1.

Referring to FIG. 10b, in each of the flash memory cell stacks of the cell stack array, the isolation insulating film is formed on one of the four rectangular side surfaces of the control electrode; the gate stack is formed on the three remaining side surfaces of the control electrode; and the isolation insulating film 8 of each of the cell stacks is connected to the isolation insulating film 8 of the adjacent cell stack. Herein, the adjacent cell stack strings of the cell stack array are disposed so as to share the first doping semiconductor area 1 or the isolation insulating film 8.

Four Embodiment

Flash Memory Cell Stack and Cell Stack String

Now, structures of a flash memory cell stack and a flash memory cell stack string using the flash memory cell stack according to a fourth embodiment of the present invention will be described with reference to the accompanying drawings. FIGS. 11a and 11b are three-dimensional perspective views illustrating a modified example of the present invention. FIGS. 11a and 11b illustrate a portion of the cell stack string, and the rectangular areas indicated by the broken lines in the upper portions of the figures illustrate the cell stacks. Hereinafter, the structures of the cell stack and the cell stack string according to the fourth embodiment of the present invention are described with reference to FIG. 11a. In order to clarify the main portions of the structure, all the structures which are to be in the upper portions of the cell stack and the cell stack string are omitted in illustration.

Referring to FIG. 11a, the cell stack according to the fourth embodiment of the present invention includes a semiconductor substrate 7, a control electrode 6 formed in a vertical pillar shape with four side surfaces on a surface of the semiconductor substrate, an insulating film 31 formed between the control electrode and the semiconductor substrate, a gate stack (3, 4, 5) formed on a first and a second side surfaces of the control electrode, a fourth insulating film 22 formed on a third and a fourth side surfaces of the control electrode, which the first and the second side surfaces of the control electrode face each other and the third and the fourth side surfaces of the control electrode face each other, a plurality of first insulating films 9 formed as layers on a side surface of the gate stack, a plurality of second doping semiconductor areas 2 formed as layers on a side surface of the gate stack, and a first doping semiconductor area 1 formed on side surfaces of the first insulating films and the second doping semiconductor areas. The first insulating films 9 and the second doping semiconductor areas 2 are alternately formed as layers on the side surface of the gate stack. The insulating film 31 is formed between the semiconductor substrate 7 and the control electrode 6. The insulating film 31 may be formed in the same manner as that of the gate stack (3, 4, 5). In FIG. 11a, a lower surface of the first doping semiconductor area 1 is in contact with and electrically connected to the semiconductor substrate 7.

FIG. 11b illustrates a modified example of the flash memory cell stack according to the fourth embodiment, which is different from the configuration of FIG. 11a in that a well 12 between the semiconductor substrate 7 and the first doping semiconductor area 1 is further included. The first doping semiconductor area 1 is formed on the well 12. The well 12 is doped with the semiconductor type opposite to that of the first doping semiconductor area 1. The first doping semiconductor area 1 and the semiconductor substrate 7 are electrically separated from each other by the well 12.

In FIGS. 11a and 11b, although the charge storage node 4 is formed on the only portions where the control electrode 6 and the second doping semiconductor area 2 are overlapped with each other, the charge storage node 4 may be formed on the entire surface of the control electrode 6. The gate stack includes the tunneling insulating film 3, the charge storage node 4, and the blocking insulating film 5. Alternatively, the gate stack may include the tunneling insulating film 3 and the charge storage node 4. Otherwise, the gate stack may include the charge storage node 4 and the blocking insulating film 5.

The charge storage node 4 is formed on all the side surfaces of the control electrode 6. Alternatively, the charge storage node 4 may be formed on only the portions where the control electrode 6 and the second doping semiconductor area 2 are overlapped with each other.

The tunneling insulating film 3 may be formed as one layer or a plurality of layers. In the case where the tunneling insulating film is formed as a plurality of layers, the adjacent layers may be made of materials having different band gaps. The blocking insulating film 5 of the gate stack may be formed as one layer or a plurality of layers. In the case where the blocking insulating film is formed as a plurality of layers, the adjacent layers may be made of materials having different band gaps. The charge storage node 4 may be formed as a conductive film made of a conductive material, as an insulating film made of an insulating material, as an insulating nano-sized dot or a nano-sized crystal, as a combination of an insulating film and a nano-sized dot. In the case where the charge storage node 4 is formed as a conductive film, the conductive film includes one or two or more among a semiconductor, a metal, a metal nitride film, a multi-element metal, and a silicide. In the case where the charge storage node is formed as an insulating film, the insulating film includes one or two or more among a nitride film and a metal oxide film. In the case where the charge storage node is formed as a nano-sized dot, the dot includes one or more among a semiconductor material, a metal oxide, a metal, a metal nitride, and a silicide material.

The control electrode 6 of the cell stack may be constructed with one or two or more combinations among highly-doped Si, poly Si, Ge, poly Ge, SiGe, poly SiGe, amorphous Si, amorphous Ge, amorphous SiGe, a metal nitride, a metal, and a silicide. Each of the cell devices of the flash memory cell stack includes the control electrode 6, the gate stack (3, 4, 5), the second doping semiconductor area 2, and the first doping semiconductor area 1.

The cell stack includes a plurality of the cell devices. Each of the cell devices includes the control electrode 6, the gate stack, the second doping semiconductor area 2, and the first doping semiconductor area 1. The cell device can sense an amount of a current due to GIDL occurring in the second doping semiconductor area 2 disposed on the side surface of the gate stack according to a state of program or erase and sense the state or degree of program or erase according to the amount of the sensed current.

In each of the cell devices of the flash memory cell stack, multiple levels of two bits or more can be stored in one cell by adjusting one or two or more among a program voltage, an erase voltage, a program time, and an erase time.

A junction occurring between the second doping semiconductor area 2 and the first doping semiconductor area 1 may be formed in an upper portion of the first insulating film 9

Figure 11:
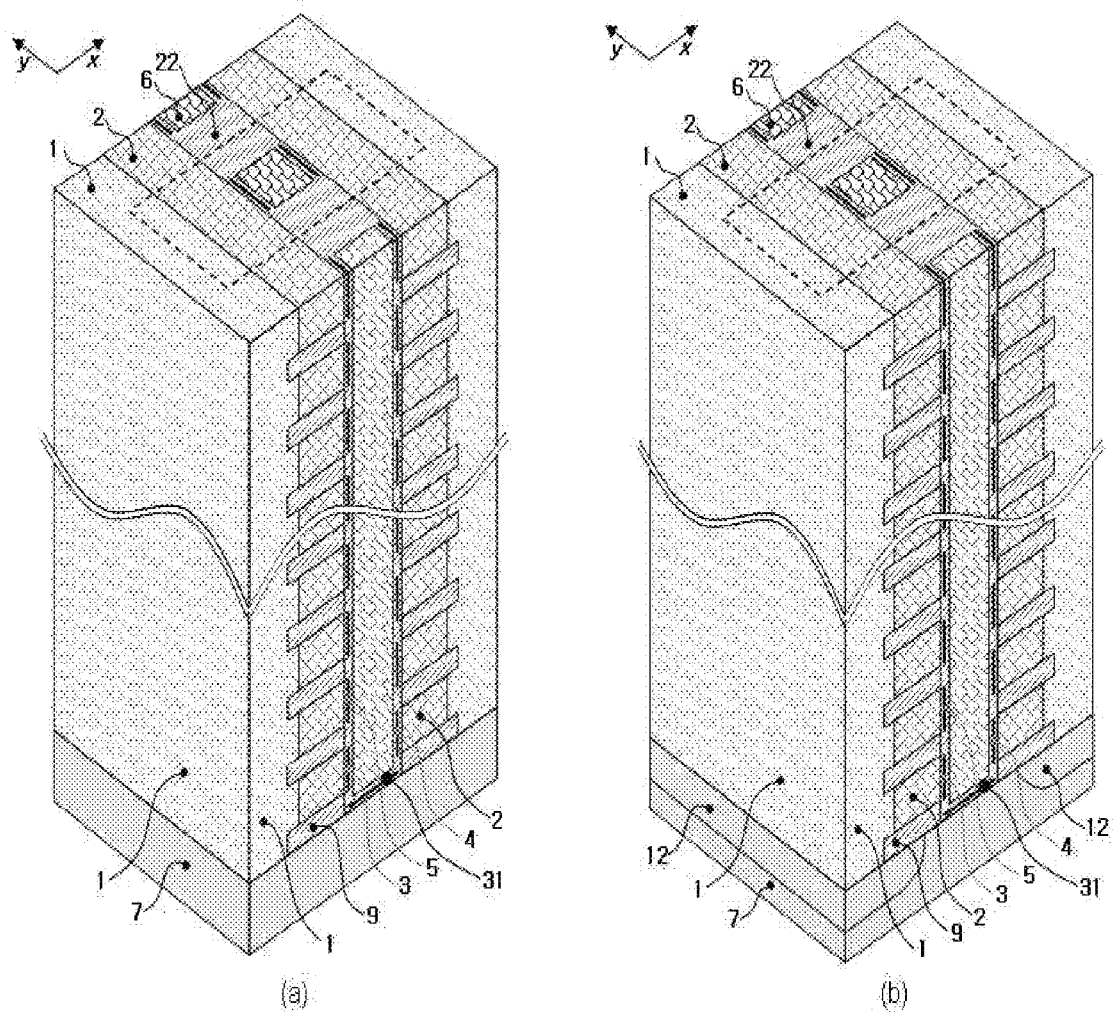
FIG. 11a and FIG. 11b are three-dimensional perspective views partially illustrating a modified example of a flash memory cell stack string according to a fourth embodiment of the present invention.

A flash memory cell stack string may be implemented by arraying the flash memory cell stacks in a row. FIG. 11 illustrates a portion of the cell stack string. In the flash memory cell stack string constructed with a plurality of the flash memory cell stacks arrayed in a row, the second doping semiconductor areas 2 of the cell stacks are connected to each other in each layer; the first insulating films 9 are also connected to each other in each layer; the fourth insulating film 22 is formed between the adjacent control electrodes; and the first doping semiconductor area 1 is connected to the side surfaces of the second doping semiconductor areas 2 and the first insulating films 9.

In the cell stack string, the first doping semiconductor area 1 may be in contact with and electrically connected to the semiconductor substrate 7.

In the cell stack string, a well 12 may be further included between the first doping semiconductor area 1 and the semiconductor substrate 7. In the flash memory cell stack string, the well 12 of each of the cell stacks is connected to the wells of the adjacent cell stacks.

The cell stack string is constructed with a plurality of the cell stacks. The description on the cell stack is the same as described above.

Figure 12:
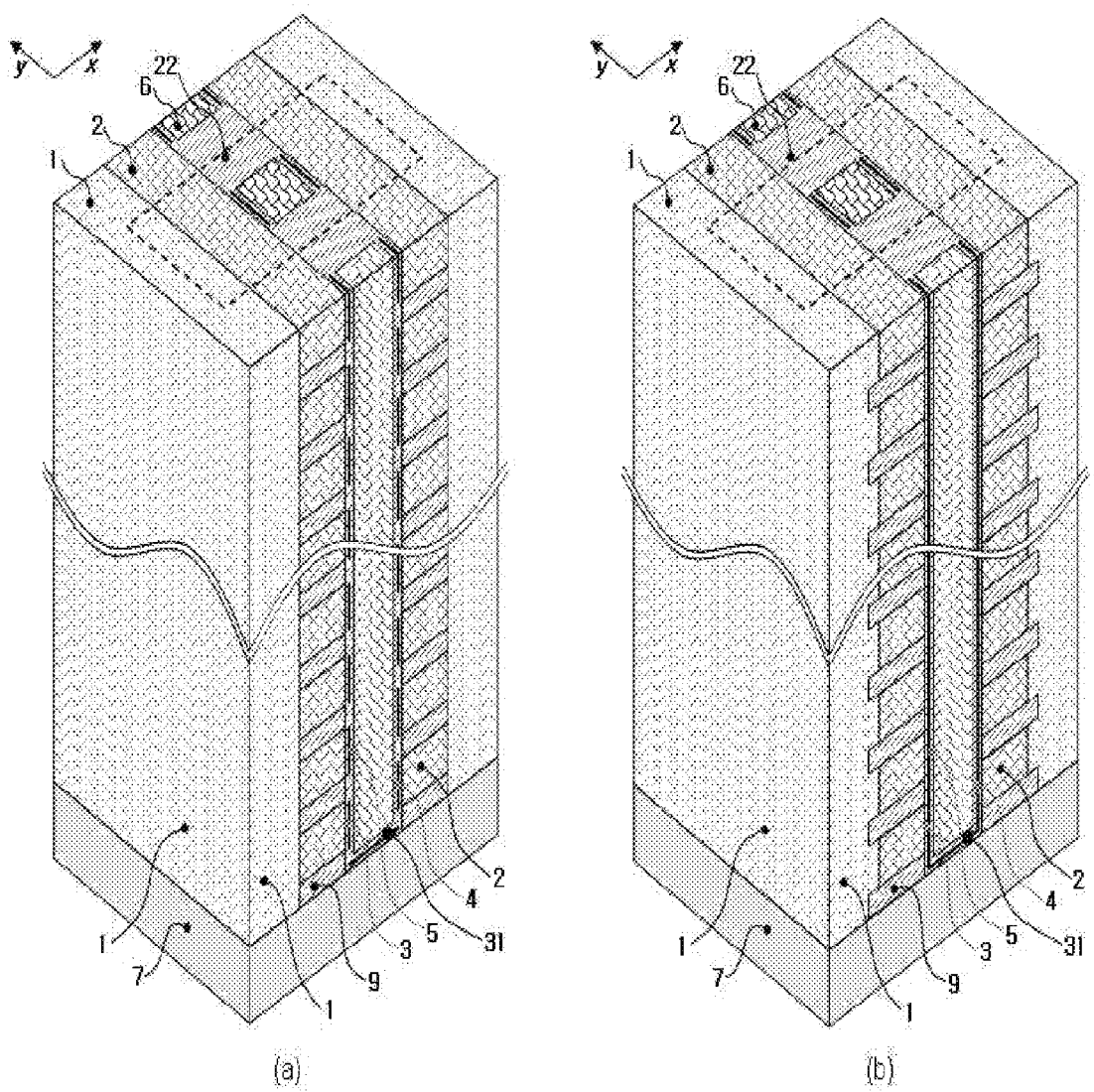
FIG. 12a and FIG. 12b are three-dimensional perspective views partially illustrating a modified example of a flash memory cell stack string according to a fifth embodiment of the present invention.

FIG. 12 is perspective views illustrating modified examples of the structure of the flash memory cell stack according to the fourth embodiment of the present invention. The structure according to the modified example illustrated in FIG. 12a is similar to that of the fourth embodiment illustrated in FIG. 11a except that a junction between the second doping semiconductor area 2 and the first doping semiconductor area 1 is aligned at the end portion of the first insulating film 9. The structure according to the modified example illustrated in FIG. 12b is similar to that of the fourth embodiment except that the charge storage node 4 is not partially formed between the side surface of the control electrode 6 and the second doping semiconductor area 2 but the charge storage node 4 is formed along the entire side surface of the control electrode 6.

Structure of Cell Stack Array

Figure 13:
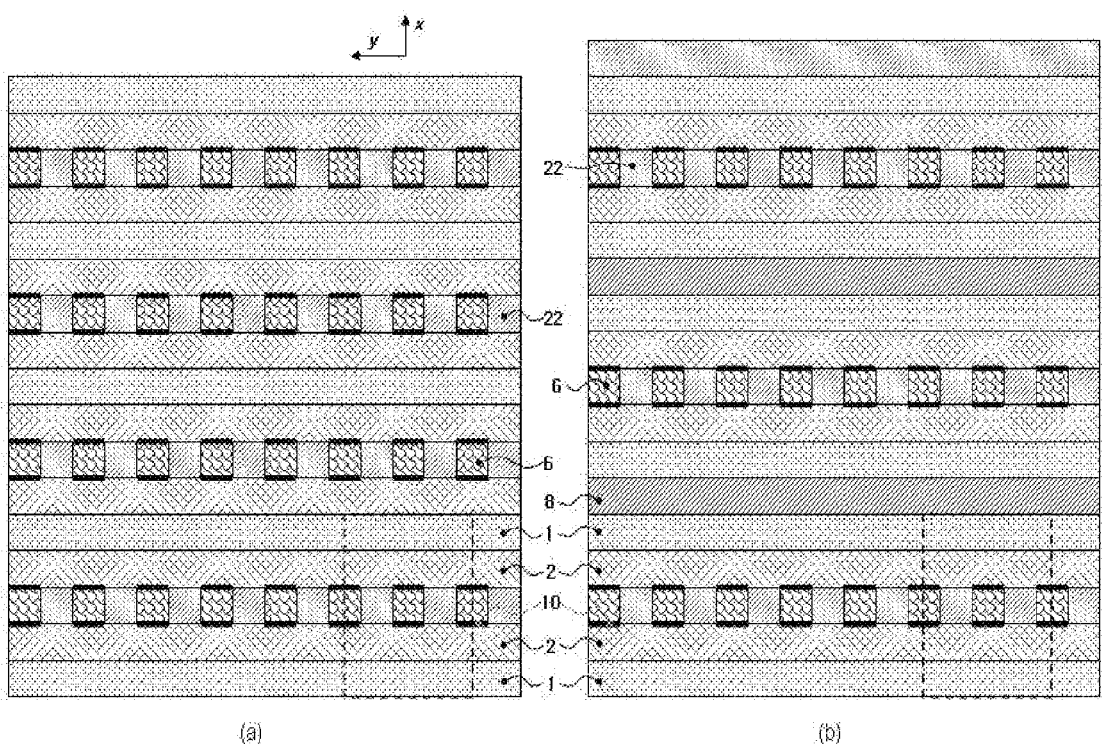
FIG. 13a-13b is plan views illustrating various modified examples of a cell stack array formed by arraying the flash memory cell stacks or the flash memory cell stack strings illustrated in FIGS. 11a, 11b, 12a, and 12b. Areas indicated by broken lines correspond to the plan views of the structures illustrated in FIGS. 11a, 11b, 12a and 12b.

A cell stack array may be implemented by arraying the flash memory cell stack strings, each of which is constructed by arraying the flash memory cell stacks according to the fourth embodiment in a row, in the left/right direction. FIG. 13 illustrates an example of a cell array implemented by using the cell stacks or the cell stack strings according to the present invention. The cell stacks are arrayed in the y axis direction to constitute each of the cell stack strings, and the cell stack strings are arrayed in the x axis direction to constitute the cell array. The rectangular areas indicated by the broken lines in the lower right portions of FIGS. 13a and 13b correspond to the plan views of the three-dimensional perspective views illustrated in FIGS. 13a and 13b.

The cell stack array includes a plurality of the flash memory cell stack strings arrayed in a row, and each of the flash memory cell stack strings includes a plurality of the flash memory cell stacks arrayed in a row. Since the structure of the flash memory cell stack is the same as that of that of the flash memory cell stack according to the aforementioned fourth embodiment, redundant description thereof is omitted.

In the cell stack array, the adjacent flash memory cell stack strings share the first doping semiconductor area 1, or the isolation insulating film 8 further formed on the side surface of the first doping semiconductor area is shared. FIG. 13a illustrates a plan view of a cell stack array where the first doping semiconductor area 1 is shared. FIG. 13b illustrates a plan view of a cell stack array where the isolation insulating film 8 further formed on the two y-axis side surfaces of the first doping semiconductor area 1 is shared.

Flash Memory Cell Stack String Considering Electrical Contact and Integration

A structure of the flash memory cell stack string using the cell stacks according to the present invention will be described with reference to FIGS. 14 and 15. In the flash memory cell stack string according to the present invention, a plurality of the flash memory cell stacks are arrayed in a row.

Figure 14:
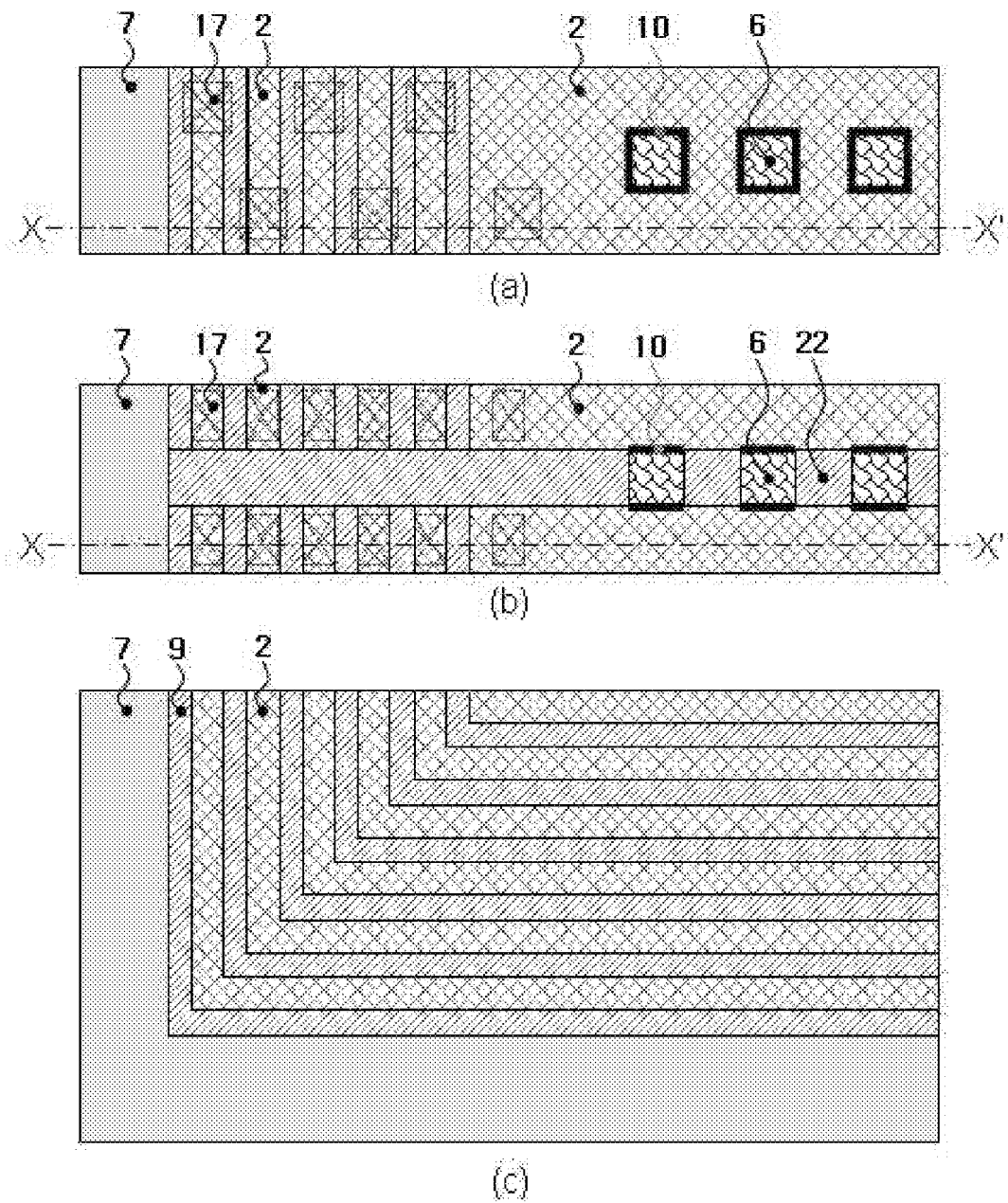
FIG. 14a and FIG. 14b are plan views illustrating a portion of the cell stack array where cell stack strings are arrayed in a row.
FIG. 14c is a cross-sectional view taken in the X-X' direction of FIG. 14b.

FIGS. 14a and 14b are plan views illustrating a portion of the cell stack string or a portion of the cell stack array where the cell stack strings are arrayed, and FIG. 14c is a cross-sectional view of FIGS. 14a and 14b taken in the X-X' direction. FIG. 14 illustrates views for explaining a fringe structure of the cell stack string. FIG. 14a is a plan view illustrating the case where a portion of the cell stack string or the cell stack array illustrated in FIGS. 5 to 10 is employed, and FIG. 14b is a plan view illustrating the case where a portion of the cell stack string or the cell stack array illustrated in FIGS. 11 to 13. FIG. 14c exemplarily illustrates the case where the second doping semiconductor area 2 is formed with six layers 6. In addition, it is should be noted that various layers may be formed. The first contact window 17 illustrated in FIGS. 14a and 14b is prepared in order to indicate the position where the first contact window 17, which is not indicated on the cross section illustrated in FIG. 14c, is to be formed in the following processes. FIG. 14 illustrates that the first contact window 17 is formed so that the second doping semiconductor areas 2 formed as a plurality of layers are electrically separated from each other on the semiconductor surface and thus, the first contact window 17 can be connected to arbitrary metal interconnection.

Figure 15:
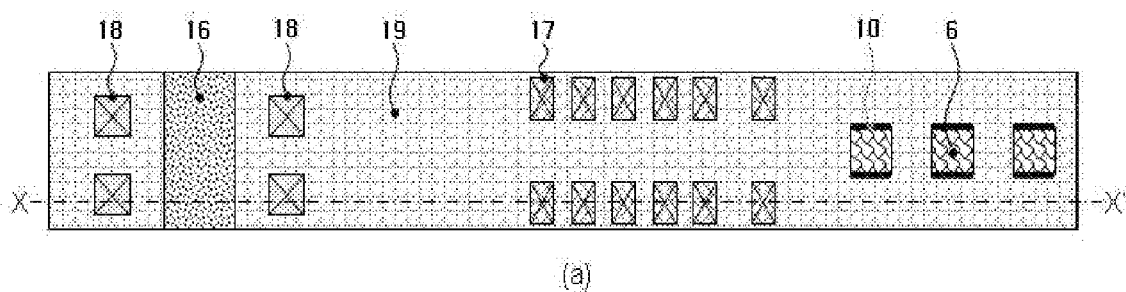
Figure 15:
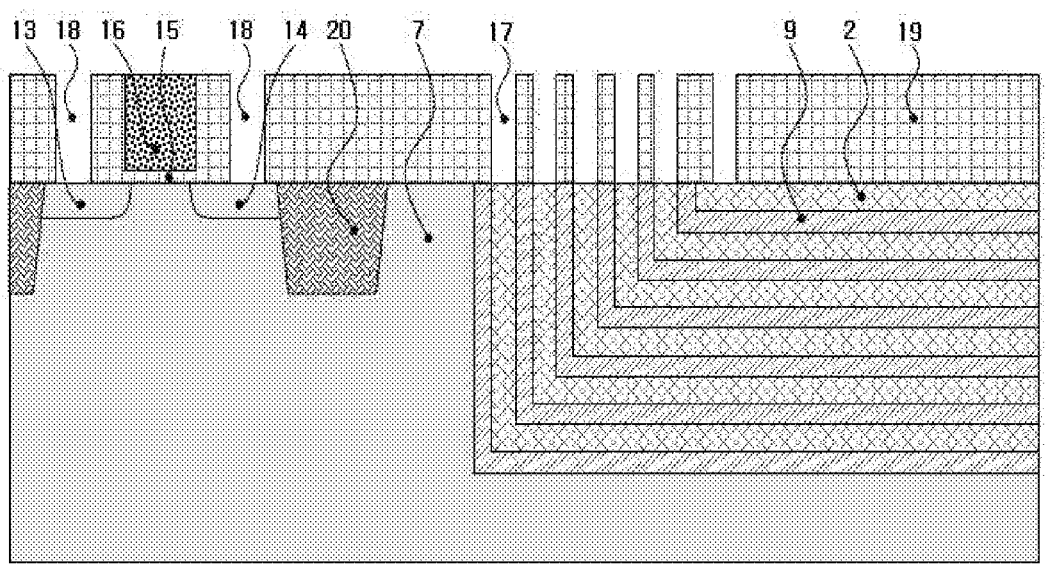

FIG. 15a is a plan view illustrating the state after a third insulating film 19 is formed in the cell stack illustrated in FIG. 11 and a contact window (contact hole) for metal interconnection is formed, and FIG. 15b is a cross-sectional view of FIG. 15a taken in the X-X' direction. FIG. 15 illustrates cross sections of the cell stack string, the fringe portion of the cell stack string, and a MOS device used for a peripheral circuit for driving of a flash memory as an example. In FIG. 15, the first contact window 17 for the memory and the first contact window 18 for the MOS device are illustrated. The contact windows may be formed simultaneously or separately. When the cell stack array is implemented by arraying the memory cell stack strings, the cell stack array and the MOS device as a peripheral circuit may be integrated in the same semiconductor substrate.

In various cell stack arrays using the cell stacks according to the present invention, the electrical contact windows 17 of the second doping semiconductor areas 2 which are formed to be electrically separated from each other in each layer may be formed on the surface through epitaxial layer growth of multi-layered L-shaped epitaxial layer. In other words, an L-shaped structure is introduced for electrical contact of the second doping semiconductor areas 2 which are formed to be separated from each other in each layer in the cell stack string, so that the structure of each of the second doping semiconductor areas 2 which are formed as layers is changed into a vertical structure. The first contact windows 17 are formed in the upper portion of the vertical structure to be connected to metal interconnection.

Cell String Fabricating Processes

Figure 16:
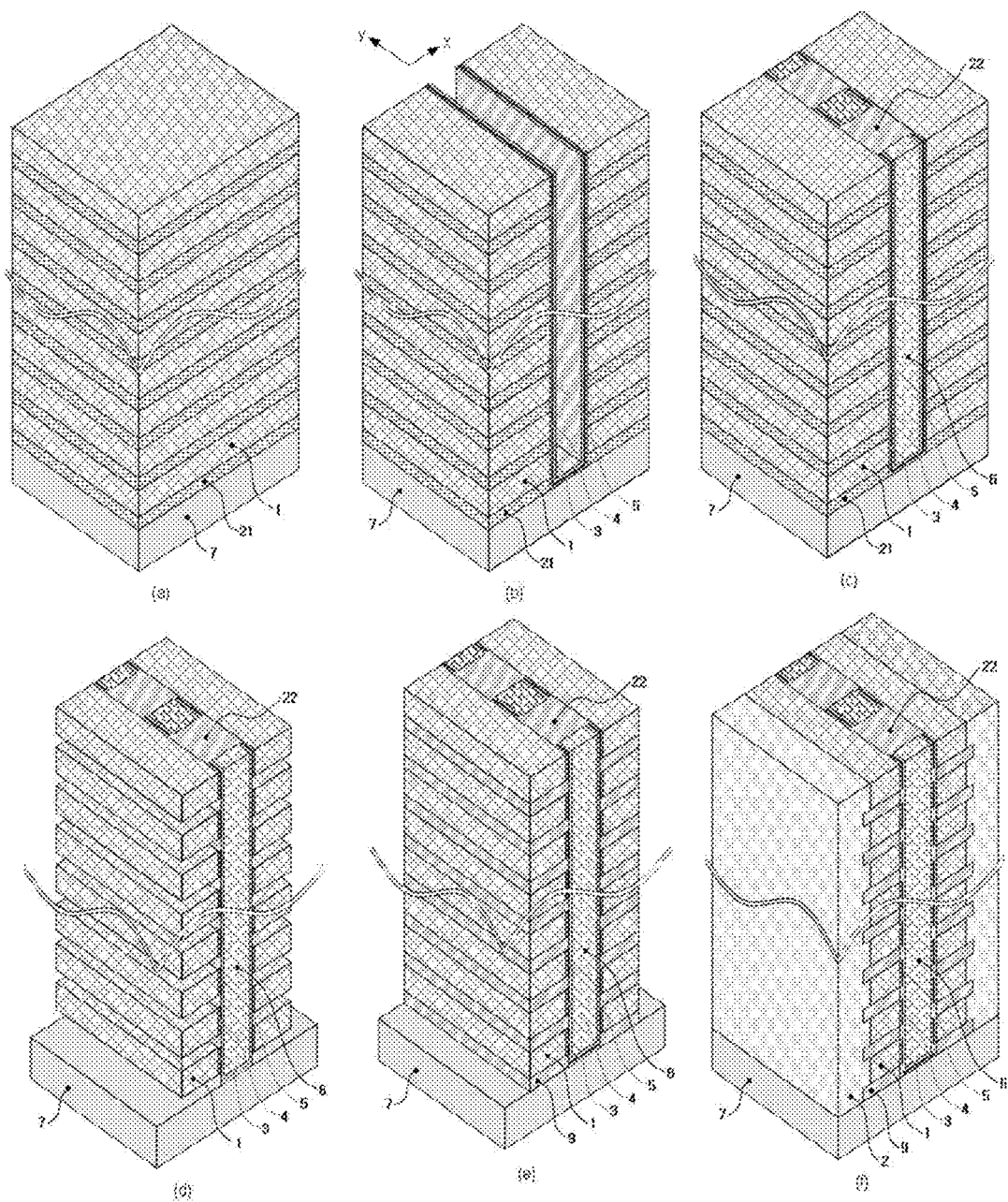

FIG. 16 is cross-sectional views sequentially illustrating an example of fabricating processes for implementing the flash memory cell stack and the flash memory cell stack string using the flash memory cell stacks according to the fourth embodiment of the present invention. For the convenience of description, FIG. 16 illustrates only the main steps. For clarifying the fabricating processes, a structure where the upper portion of the stack structure is cut, and the description is made with reference to the structure. Hereinafter, the fabricating processes of the flash memory cell stack according to the fourth embodiment of the present invention will be described with reference to FIG. 16.

First, referring to FIG. 16a, by repetitively performing an epitaxial growing process on the semiconductor substrate 7, a sacrifice semiconductor layers 21 and a second doping semiconductor area layer 2 are alternately formed on the surface of the semiconductor substrate (Step (a)). Herein, the sacrifice semiconductor layer 21, the second doping semiconductor area layer 2, or both of the two layers may be doped with an n type or a p type. The sacrifice semiconductor layers 21 may be substituted with the first insulating films 9 through post processes. The Step (a) of forming the multi-layered epitaxial layer may include a step of a fifth insulating film 23 on the semiconductor substrate 7 and performing pattering a step of etching the semiconductor substrate 7 so that a portion of the semiconductor substrate 7 under the fifth insulating film 23 is also etched, and a step of alternately growing an L-shaped sacrifice semiconductor layer 21 and second doping semiconductor area layer 2 as an epitaxial layer on the surface of the exposed semiconductor substrate.

Next, referring to FIG. 16b, after a mask pattern is formed on the resulting product of the step (a), performing etching so that a trench where the semiconductor substrate 7 is exposed is formed; and after that, a gate stack is formed on an internal sidewall and a bottom surface of the trench (Step (b)). In the above etching process, the second doping semiconductor area 2 and the sacrifice semiconductor layer 21 can be easily etched under the same etching condition.

Next, referring to FIG. 16c, the internal portion of the trench where the gate stack is formed is filled with a control electrode material, and after an unnecessary portion of the control electrode material is removed through a masking process, the removed area is filled with an insulating material, so that control electrodes 6 and fourth insulating films 22 are formed (Step (c)). Due to the fourth insulating films 22, the pillar-shaped control electrodes 6 disposed in a row can be electrically separated from.

Next, referring to FIG. 16d, after a mask pattern is formed on the grown multi-layered sacrifice semiconductor layer 21 and the second doping semiconductor area layer 2, etching is performed, and the exposed sacrifice semiconductor layer 21 is selectively etched (Step (d)). In the step (d), after the step of selectively etching the sacrifice semiconductor layer 21, a step of selectively etching a portion of or the entire of the exposed gate stack may be further included.

Next, referring to FIG. 16e, a first insulating film 9 is formed in the space of the etched sacrifice semiconductor layer 21 (Step (e)). Next, referring to FIG. 16f, a first doping semiconductor area 1 is formed in the exposed second doping semiconductor area 2 of the resulting product through a selective epitaxial layer growing process (Step (f)). In the step (f), before the selective epitaxial layer growing process, a portion of the side surface of the exposed second doping semiconductor area 2 may be etched through an etching process, and the epitaxial layer growing process may be performed. After the step (f), an insulating film may be formed; contact windows may be formed at positions where the contact windows (contact holes) are needed; and a metal layer may be sequentially formed.

Figure 17:
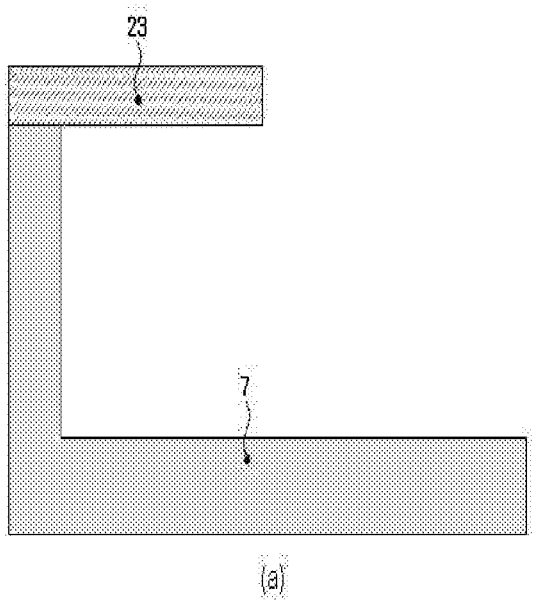
Figure 17:
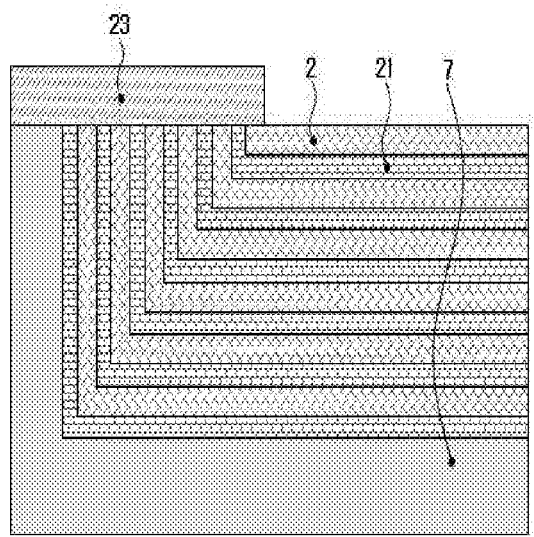

FIG. 17 illustrates main processes performed before the epitaxial layer growing process of alternately growing the sacrifice semiconductor layers 21 and the second doping semiconductor areas 2 as described in FIG. 16a. First, referring to FIG. 17a, after a fifth insulating film is formed on the semiconductor substrate 7 and patterning is performed, the semiconductor substrate 7 is selectively etched using the patterned fifth insulating film 23 as a mask. At this time, in the case where the semiconductor substrate is isotropically etched, the etching is performed in the horizontal direction as well as the vertical direction, so that "undercut" is formed as illustrated in FIG. 17a. Herein, surface treatment for improving a quality of the epitaxial layer is performed, and the sacrifice semiconductor layers 21 and the second doping semiconductor areas 2 are alternately grown as illustrated in FIG. 17b, so that the structure illustrated in FIG. 16a is implemented.

Figure 18:
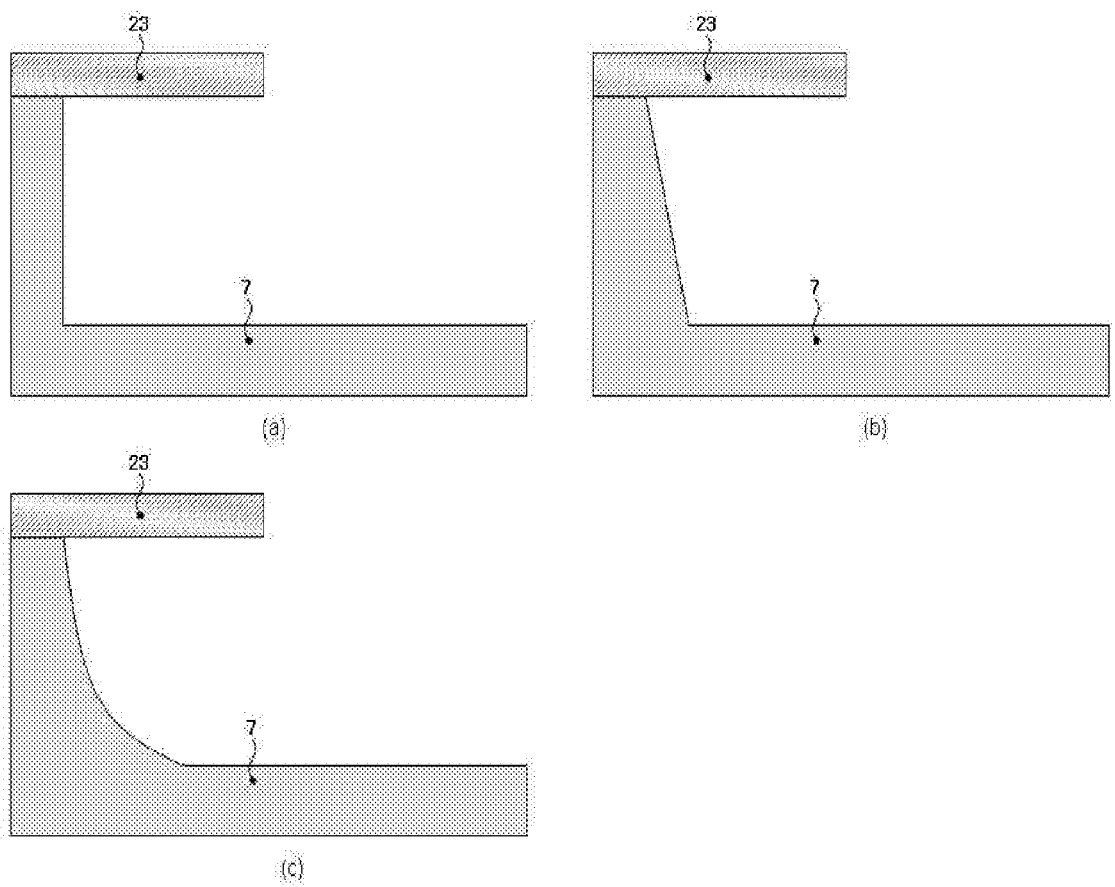
FIG. 18a-18c is cross-sectional views illustrating representative structures of "undercut" which can be implemented in a selective etching process for a semiconductor substrate 7 described in FIG. 17.

FIG. 18 is cross-sectional views illustrating representative structures of the aforementioned "undercut" which can be implemented in the selective etching process for the semiconductor substrate 7 described in FIG. 17.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

A cell stack, a cell stack string, and a cell stack array according to the present invention can be widely used in highly-integrated non-volatile semiconductor memory fields.

The invention claimed is:

1. A flash memory cell stack comprising:
   a semiconductor substrate;
   a control electrode provided in a vertical pillar shape on a surface of the semiconductor substrate;
   an insulating film provided between the control electrode and the semiconductor substrate;
   a gate stack provided on a side surface of the control electrode;
   a plurality of first insulating films provided as layers on a side surface of the gate stack;
   a plurality of second doping semiconductor areas provided as layers on the side surface of the gate stack; and
   a first doping semiconductor area provided on side surfaces of the first insulating films and the second doping semiconductor areas,
   wherein the first insulating films and the second doping semiconductor areas are alternately provided on the side surface of the gate stack, and
   wherein the first doping semiconductor area and the second doping semiconductor area are doped with opposite types of impurities.

2. The flash memory cell stack according to claim 1 further comprising a fourth insulating film,
   wherein the control electrode has four side surfaces,
   the gate stack is provided on a first and a second side surfaces of the control electrode, which face each other,
   the fourth insulating film is provided on a third and a fourth side surfaces of the control electrode, which face each other.

3. The flash memory cell stack according to claim 1, wherein a lower surface of the first doping semiconductor area is in contact with and electrically connected to the semiconductor substrate.

4. The flash memory cell stack according to claim 1, further comprising a well between the first doping semiconductor area and the semiconductor substrate.

5. The flash memory cell stack according to claim 1, wherein the gate stack is constructed with the tunneling insulating film, the charge storage node, and the blocking insulating film, constructed with the tunneling insulating film and the charge storage node, or constructed with the charge storage node and the blocking insulating film.

6. The flash memory cell stack according to claim 5, wherein the charge storage node is provided on all the side surfaces of the control electrode or on only the portions where the control electrode and the second doping semiconductor area are overlapped with each other.

7. The flash memory cell stack according to claim 1, wherein the surface of the second doping semiconductor area contacting with the gate stack may be provided so that the central portion thereof in the direction parallel to the control electrode or in the direction intersecting the control electrode is protruded or so that the central portion in the area overlapped with the control electrode is protruded.

8. The flash memory cell stack according to claim 1,
   wherein the cell stack includes a plurality of the cell devices, and each of the cell devices includes the control electrode, the gate stack, the second doping semiconductor area, and the first doping semiconductor area, and
   wherein the cell device senses an amount of a current due to GIDL occurring in the second doping semiconductor area disposed on the side surface of the gate stack according to a state of program or erase and senses the state or degree of program or erase according to the amount of the sensed current.

9. The flash memory cell stack according to claim 8, wherein the cell device is configured so that multiple levels of two bits or more can be stored in one cell by adjusting one or two or more among a program voltage, an erase voltage, a program time, and an erase time.

10. The flash memory cell stack according to claim 1, wherein a junction between the second doping semiconductor area and the first doping semiconductor area is provided in an upper portion of the first insulating film.

11. A cell stack array having a plurality of flash memory cell stack strings arrayed in a row, each of the flash memory cell stack strings including a plurality of flash memory cell stacks arrayed in a row, each of the flash memory cell stacks including:
    a semiconductor substrate;
    a control electrode provided in a vertical pillar shape on a surface of the semiconductor substrate;
    an insulating film provided between the control electrode and the semiconductor substrate;
    a gate stack provided on a side surface of the control electrode;
    a plurality of first insulating films provided as layers on a side surface of the gate stack;
    a plurality of second doping semiconductor areas provided as layers on the side surface of the gate stack; and
    a first doping semiconductor area provided on side surfaces of the first insulating films and the second doping semiconductor areas,
    wherein the first insulating films and the second doping semiconductor areas are alternately provided as layers on a side surface of the gate stack, and
    wherein the first doping semiconductor area and the second doping semiconductor area are doped with opposite types of impurities,
    wherein the second doping semiconductor areas of the cell stacks constituting the cell stack string are connected to each other in each layer, the first insulating films of the cell stacks are also connected to each other in each layer, and the first doping semiconductor area is connected to the side surfaces of the second doping semiconductor areas and the first insulating films, and
    wherein the adjacent flash memory cell stack strings share the first doping semiconductor area or an isolation insulating film is further included between the first doping semiconductor areas of the adjacent flash memory cell stack strings.

12. The cell stack array according to claim 11, wherein each of the flash memory cell stacks further includes a fourth insulating film,
    the control electrodes have four side surfaces, the gate stacks form on a first and a second side surfaces of the control electrode, which face each other, the fourth insulating film forms on a third and a fourth side surfaces of the control electrode, which face each other.

13. The cell stack array according to claim 11, wherein the cell stack string is configured so that the second doping semiconductor area provided as layers are provided as a L-shaped structure, a first contact window is provided on the upper surface of the L-shaped structure, and the first contact window is connected to metal interconnection.

14. The cell stack array according claim 11, wherein the cell stack array and MOS devices as peripheral circuits are integrated in the same semiconductor substrate.

* * * * *